(12) United States Patent
Lutz et al.

(10) Patent No.: US 7,221,241 B2
(45) Date of Patent: *May 22, 2007

(54) METHOD FOR ADJUSTING THE FREQUENCY OF A MEMS RESONATOR

(75) Inventors: Markus Lutz, Palo Alto, CA (US); Aaron Partridge, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/490,823

(22) Filed: Jul. 21, 2006

(65) Prior Publication Data

US 2006/0255881 A1 Nov. 16, 2006

Related U.S. Application Data

(62) Division of application No. 10/833,433, filed on Apr. 28, 2004, now Pat. No. 7,102,467.

(51) Int. Cl.
*H03H 3/013* (2006.01)
*H03H 9/46* (2006.01)

(52) U.S. Cl. .................. 333/186; 333/197; 333/200; 333/188; 324/691; 324/703; 438/795; 438/50; 438/52

(58) Field of Classification Search ............. 333/186, 333/188, 197, 198, 200; 324/691, 703; 438/795, 50, 52

See application file for complete search history.

(56) References Cited

U.S. PATENT DOCUMENTS

| | | | |
|---|---|---|---|
| 4,674,319 A | 6/1987 | Muller et al. | |
| 4,849,071 A | 7/1989 | Evans et al. | |
| 4,945,769 A | 8/1990 | Sidner et al. | |
| 4,990,462 A | 2/1991 | Sliwa, Jr. | |
| 5,075,253 A | 12/1991 | Sliwa, Jr. | |
| 5,156,903 A | 10/1992 | Okumura et al. | |
| 5,445,991 A | 8/1995 | Lee | |
| 5,455,547 A | 10/1995 | Lin et al. | |

(Continued)

FOREIGN PATENT DOCUMENTS

EP 1 217 735 8/2002

(Continued)

OTHER PUBLICATIONS

"Vacuum Sealing of Microcavities Using Metal Evaporation", Bartek et al., Sensor and Actuators A 61, 1997, pp. 364-368.

(Continued)

*Primary Examiner*—Barbara Summons
(74) *Attorney, Agent, or Firm*—Neil A. Steinberg

(57) ABSTRACT

There are many inventions described and illustrated herein. These inventions are directed to a method of fabricating a microelectromechanical resonator having an output frequency that may be adjusted, tuned, set, defined and/or selected whether before and/or after final packaging. In one aspect, the method of the present invention adjusts, tunes, sets, defines and/or selects the frequency of the microelectromechanical resonator by changing and/or removing material from the mechanical structure of the resonator by resistively heating (in a selective or non-selective manner) one or more elements and/or beams of the mechanical structure (for example, the moveable or expandable electrodes and/or frequency adjustment structures).

47 Claims, 17 Drawing Sheets

U.S. PATENT DOCUMENTS

| | | | |
|---|---|---|---|
| 5,461,916 A | 10/1995 | Fujii et al. |
| 5,470,797 A | 11/1995 | Mastrangelo |
| 5,491,604 A | 2/1996 | Nguyen et al. |
| 5,504,026 A | 4/1996 | Kung |
| 5,510,156 A | 4/1996 | Zhao |
| 5,517,123 A | 5/1996 | Zhao et al. |
| 5,537,083 A | 7/1996 | Lin et al. |
| 5,540,095 A | 7/1996 | Sherman et al. |
| 5,583,290 A | 12/1996 | Lewis |
| 5,589,082 A | 12/1996 | Lin et al. |
| 5,604,312 A | 2/1997 | Lutz |
| 5,613,611 A | 3/1997 | Johnson et al. |
| 5,616,514 A | 4/1997 | Muchow et al. |
| 5,620,931 A | 4/1997 | Tsang et al. |
| 5,627,317 A | 5/1997 | Offenberg et al. |
| 5,627,318 A | 5/1997 | Fujii et al. |
| 5,631,422 A | 5/1997 | Sulzberger et al. |
| 5,640,039 A | 6/1997 | Chau et al. |
| 5,679,436 A | 10/1997 | Zhao |
| 5,683,591 A | 11/1997 | Offenberg |
| 5,703,293 A | 12/1997 | Zabler et al. |
| 5,721,377 A | 2/1998 | Kurle et al. |
| 5,723,353 A | 3/1998 | Muenzel et al. |
| 5,728,936 A | 3/1998 | Lutz |
| 5,751,041 A | 5/1998 | Suzuki et al. |
| 5,760,455 A | 6/1998 | Hierold et al. |
| 5,761,957 A | 6/1998 | Oba et al. |
| 5,804,083 A | 9/1998 | Ishii et al. |
| 5,818,227 A | 10/1998 | Payne et al. |
| 5,839,062 A | 11/1998 | Nguyen et al. |
| 5,847,280 A | 12/1998 | Sherman et al. |
| 5,858,809 A | 1/1999 | Chau et al. |
| 5,872,024 A | 2/1999 | Fujii et al. |
| 5,880,369 A | 3/1999 | Samuels et al. |
| 5,889,207 A | 3/1999 | Lutz |
| 5,898,218 A | 4/1999 | Hirose et al. |
| 5,914,553 A | 6/1999 | Adams et al. |
| 5,919,364 A | 7/1999 | Lebouitz et al. |
| 5,922,212 A | 7/1999 | Kano et al. |
| 5,937,275 A | 8/1999 | Münzel et al. |
| 5,948,991 A | 9/1999 | Nomura et al. |
| 5,955,932 A | 9/1999 | Nguyen et al. |
| 5,959,208 A | 9/1999 | Muenzel et al. |
| 5,969,249 A | 10/1999 | Roessig et al. |
| 5,976,994 A | 11/1999 | Nguyen et al. |
| 5,986,316 A | 11/1999 | Toyoda et al. |
| 5,987,989 A | 11/1999 | Yamamoto et al. |
| 5,992,233 A | 11/1999 | Clark |
| 6,009,753 A | 1/2000 | Tsang et al. |
| 6,028,332 A | 2/2000 | Kano et al. |
| 6,035,714 A | 3/2000 | Yazdi et al. |
| 6,048,774 A | 4/2000 | Yamamoto et al. |
| 6,055,858 A | 5/2000 | Muenzel et al. |
| 6,065,341 A | 5/2000 | Ishio et al. |
| 6,067,858 A | 5/2000 | Clark et al. |
| 6,090,718 A | 7/2000 | Soga et al. |
| 6,100,108 A | 8/2000 | Mizuno et al. |
| 6,106,735 A | 8/2000 | Kurle et al. |
| 6,117,701 A | 9/2000 | Buchan et al. |
| 6,119,518 A | 9/2000 | Itou et al. |
| 6,122,964 A | 9/2000 | Mohaupt et al. |
| 6,125,700 A | 10/2000 | Tsugai et al. |
| 6,140,709 A | 10/2000 | Muenzel et al. |
| 6,142,358 A | 11/2000 | Cohn et al. |
| 6,146,917 A | 11/2000 | Zhang et al. |
| 6,147,756 A | 11/2000 | Zavracky et al. |
| 6,149,190 A | 11/2000 | Galvin et al. |
| 6,151,966 A | 11/2000 | Sakai et al. |
| 6,153,839 A | 11/2000 | Zavracky et al. |
| 6,156,652 A | 12/2000 | Michalicek |
| 6,163,643 A | 12/2000 | Bergmann et al. |
| 6,169,321 B1 | 1/2001 | Nguyen et al. |
| 6,170,332 B1 | 1/2001 | MacDonald et al. |
| 6,171,881 B1 | 1/2001 | Fujii |
| 6,187,210 B1 | 2/2001 | Lebouitz et al. |
| 6,187,607 B1 | 2/2001 | Offenberg et al. |
| 6,191,007 B1 | 2/2001 | Matsui et al. |
| 6,192,757 B1 | 2/2001 | Tsang et al. |
| 6,199,430 B1 | 3/2001 | Kano et al. |
| 6,199,874 B1 | 3/2001 | Galvin et al. |
| 6,204,085 B1 | 3/2001 | Strumpell et al. |
| 6,210,988 B1 | 4/2001 | Howe et al. |
| 6,214,243 B1 | 4/2001 | Muenzel et al. |
| 6,218,717 B1 | 4/2001 | Toyoda et al. |
| 6,227,049 B1 | 5/2001 | Fujii |
| 6,227,050 B1 | 5/2001 | Fujii et al. |
| 6,230,567 B1 | 5/2001 | Greiff |
| 6,233,811 B1 | 5/2001 | Payne et al. |
| 6,236,281 B1 | 5/2001 | Nguyen et al. |
| 6,238,946 B1 | 5/2001 | Ziegler |
| 6,240,782 B1 | 6/2001 | Kato et al. |
| 6,244,112 B1 | 6/2001 | Fujii |
| 6,245,593 B1 | 6/2001 | Yoshihara et al. |
| 6,249,073 B1 | 6/2001 | Nguyen et al. |
| 6,250,156 B1 | 6/2001 | Seshia et al. |
| 6,250,165 B1 | 6/2001 | Sakai et al. |
| 6,251,754 B1 | 6/2001 | Ohshima et al. |
| 6,255,741 B1 | 7/2001 | Yoshihara et al. |
| 6,264,363 B1 | 7/2001 | Takahashi et al. |
| 6,274,452 B1 | 8/2001 | Miura et al. |
| 6,275,034 B1 | 8/2001 | Tran et al. |
| 6,276,207 B1 | 8/2001 | Sakai et al. |
| 6,279,585 B1 | 8/2001 | Shiraki et al. |
| 6,282,960 B1 | 9/2001 | Samuels et al. |
| 6,284,670 B1 | 9/2001 | Abe et al. |
| 6,287,885 B1 | 9/2001 | Muto et al. |
| 6,291,315 B1 | 9/2001 | Nakayama et al. |
| 6,291,875 B1 | 9/2001 | Clark et al. |
| 6,296,779 B1 | 10/2001 | Clark et al. |
| 6,297,072 B1 | 10/2001 | Tilmans et al. |
| 6,300,294 B1 | 10/2001 | Robbins et al. |
| 6,307,815 B1 | 10/2001 | Polosky et al. |
| 6,308,567 B1 | 10/2001 | Higuchi et al. |
| 6,311,555 B1 | 11/2001 | McCall et al. |
| 6,315,062 B1 | 11/2001 | Alft et al. |
| 6,318,175 B1 | 11/2001 | Muchow et al. |
| 6,323,550 B1 | 11/2001 | Martin et al. |
| 6,325,886 B1 | 12/2001 | Harris et al. |
| 6,352,935 B1 | 3/2002 | Collins et al. |
| 6,373,007 B1 | 4/2002 | Calcatera et al. |
| 6,378,989 B1 | 4/2002 | Silverbrook |
| 6,386,032 B1 | 5/2002 | Lemkin et al. |
| 6,388,279 B1 | 5/2002 | Sakai et al. |
| 6,389,899 B1 | 5/2002 | Partridge et al. |
| 6,389,903 B1 | 5/2002 | Oba et al. |
| 6,391,674 B2 | 5/2002 | Ziegler |
| 6,392,144 B1 | 5/2002 | Filter et al. |
| 6,396,711 B1 | 5/2002 | Degani et al. |
| 6,402,968 B1 | 6/2002 | Yazdi et al. |
| 6,416,831 B1 | 7/2002 | Hara et al. |
| 6,422,078 B2 | 7/2002 | Imai |
| 6,423,563 B2 | 7/2002 | Fukada et al. |
| 6,424,074 B2 | 7/2002 | Nguyen |
| 6,429,506 B1 | 8/2002 | Fujii et al. |
| 6,429,755 B2 | 8/2002 | Speidell et al. |
| 6,433,401 B1 | 8/2002 | Clark et al. |
| 6,433,411 B1 | 8/2002 | Degani et al. |
| 6,437,551 B1 | 8/2002 | Krulevitch et al. |
| 6,440,766 B1 | 8/2002 | Clark |
| 6,441,481 B1 | 8/2002 | Karpman |
| 6,443,008 B1 | 9/2002 | Funk et al. |
| 6,444,543 B2 | 9/2002 | Sakai et al. |
| 6,448,109 B1 | 9/2002 | Karpman |
| 6,448,604 B1 | 9/2002 | Funk et al. |

| | | |
|---|---|---|
| 6,448,622 B1 | 9/2002 | Franke et al. |
| 6,449,406 B1 | 9/2002 | Fan et al. |
| 6,460,234 B1 | 10/2002 | Gianchandani |
| 6,462,566 B1 | 10/2002 | Schoefthaler et al. |
| 6,463,803 B2 | 10/2002 | Fujii et al. |
| 6,465,281 B1 | 10/2002 | Xu et al. |
| 6,472,290 B2 | 10/2002 | Cho et al. |
| 6,477,901 B1 | 11/2002 | Tadigadapa et al. |
| 6,478,974 B1 | 11/2002 | Lebouitz et al. |
| 6,483,957 B1 | 11/2002 | Hamerly et al. |
| 6,495,389 B2 | 12/2002 | Ishio et al. |
| 6,507,044 B1 | 1/2003 | Santana, Jr. et al. |
| 6,507,082 B2 | 1/2003 | Thomas |
| 6,507,983 B1 * | 1/2003 | Ruby et al. ............... 29/25.35 |
| 6,508,124 B1 | 1/2003 | Zerbini et al. |
| 6,508,126 B2 | 1/2003 | Sakai et al. |
| 6,508,561 B1 | 1/2003 | Alie et al. |
| 6,512,255 B2 | 1/2003 | Aoki et al. |
| 6,521,508 B1 | 2/2003 | Cheong et al. |
| 6,521,965 B1 | 2/2003 | Lutz |
| 6,522,052 B2 | 2/2003 | Kihara et al. |
| 6,524,890 B2 | 2/2003 | Ueda et al. |
| 6,531,767 B2 | 3/2003 | Shrauger |
| 6,534,340 B1 | 3/2003 | Karpman et al. |
| 6,550,331 B2 | 4/2003 | Fujii et al. |
| 6,550,339 B1 | 4/2003 | Toyoda et al. |
| 6,551,853 B2 | 4/2003 | Toyoda |
| 6,552,404 B1 | 4/2003 | Hynes et al. |
| 6,555,417 B2 | 4/2003 | Spooner et al. |
| 6,555,901 B1 | 4/2003 | Yoshihara et al. |
| 6,555,904 B1 | 4/2003 | Karpman |
| 6,558,976 B2 | 5/2003 | Shrauger |
| 6,624,726 B2 | 9/2003 | Niu et al. |
| 6,707,351 B2 | 3/2004 | Gorrell |
| 7,102,467 B2 * | 9/2006 | Lutz et al. ................. 333/186 |
| 2001/0001931 A1 | 5/2001 | Fujii et al. |
| 2001/0009110 A1 | 7/2001 | Tmai |
| 2001/0034076 A1 | 10/2001 | Martin |
| 2002/0136047 A1 | 9/2002 | Funk et al. |
| 2003/0020565 A1 | 1/2003 | Cornett et al. |
| 2003/0049878 A1 | 3/2003 | Offenberg et al. |
| 2003/0051550 A1 | 3/2003 | Nguyen et al. |
| 2003/0173330 A1 | 9/2003 | Lutz |
| 2003/0184412 A1 | 10/2003 | Gorrell |
| 2004/0053434 A1 | 3/2004 | Bruner |
| 2004/0061564 A1 | 4/2004 | Photiadis et al. |
| 2004/0085159 A1 | 5/2004 | Kubene et al. |
| 2004/0148771 A1 | 8/2004 | Ma et al. |
| 2004/0183603 A1 | 9/2004 | Ma et al. |
| 2005/0162040 A1 | 7/2005 | Robert |
| 2005/0195049 A1 | 9/2005 | Huang et al. |

FOREIGN PATENT DOCUMENTS

WO     WO 03/069776     8/2003

OTHER PUBLICATIONS

"Vacuum Packaging Technology Using Localized Aluminum/Silicon-to-Glass Bonding", Cheng et al., MEMS 2001, 14th IEEE International Conference, pp. 18-21.

"A Hermetic Glass-Silicon Package Formed Using Localized Aluminum/Silicon-Glass Bonding", Cheng et al., Journal of Microelectromechanical Systems, vol. 10, No. 3, Sep. 2001, pp. 392-399.

"MEMS Post-Packaging by Localized Heating and Bonding", Lin, IEEE Transactions on Advanced Packaging, vol. 23, No. 4, Nov. 2000, pp. 608-616.

"Localized Silicon Fusion and Eutectic Bonding for MEMS Fabrication and Packaging", Cheng et al., Journal of Microelectromechanical Systems, vol. 9, No. 1, Mar. 2000, pp. 3-8.

"Localized Bonding with PSG or Indium Solder as Intermediate Layer", Cheng et al., MEMS 1999, 12th IEEE International Conference, pp. 285-289.

"Vacuum encapsulation of resonant devices using permeable polysilicon", Lebouitz et al., Micro Electro Mechanical Systems, IEEE International Conference, Jan. 1999, pp. 470-475.

"Electrical and optical characteristics of vacuum-sealed polysilicon microlamps", Mastrangelo et al., IEEE Transactions on Electron Devices, v.39, No. 6, Jun. 1992, pp. 1363-1375.

"Vacuum-sealed silicon micromachined incandescent light source", Mastrangelo et al., IEDM, 1989, pp. 503-506.

"Sealing of Micromachined Cavities Using Chemical Vapor Deposition Methods: Characterization and Optimization", Liu and Tai, IEEE Journal of Microelectromechanical Systems, vol. 8, No. 2, Jun. 1999, pp. 135-145.

"Vacuum Packaging Technology Using Localized Aluminum/Silicon-to-Glass Bonding", Cheng et al., IEEE Journal of Microelectromechanical Systems, vol. 11, No. 6, Oct. 2002, pp. 556-565.

"Novel Process for a Monolithic Integrated Accelerometer", Offenberg et al., The 8th International Conference on Solid-State Sensors and Actuators, and Eurosensors IX, Stockholm, Sweden, Jun. 25-29, 1995, pp. 589-592.

"An Integrated Wafer-Scale Packaging Process for MEMS", Kenny et al., Proceedings of IMECE2002, ASME International Mechanical Engineering Congress & Exposition, Nov. 17-22, 2002, New Orleans, Louisiana, pp. 51-54.

"Polysilicon Vibrating Gyroscope Vacuum-Encapsulated in an on-chip Micro Chamber", Tsuchiya et al., Sensors and Actuators A 90 (2001), pp. 49-55.

"New Thin Film Epitaxial Polysilicon Encapsulation for Piezoresistive Accelerometers", Partridge et al., IEEE, 2001, pp. 54-59.

"A Low Temperature Bi-CMOS Compatible Process for MEMS RF Resonators and Filters", Lund et al., Solid-State Sensor, Actuator and Microsystems Workshop, Hilton Head Island, South Carolina, Jun. 2-6, 2002, pp. 38-41.

"Wafer Scale Encapsulation of a High-Q Micromechanical Resonator", Candler et al., Hilton Head, Open Poster, 2002.

"Sealed Vacuum Electronic Devices by Surface Micromachining", Zurn et al., IEEE IEDM 91, Sep. 1991, p. 205-208.

"MEMS for Watches," Noell et al., MEMS 2004, IEEE, Jan. 2004, pp. 25-29.

"Micro Electromechanical Filters for Signal Processing", Lin et al., Micro Electro Mechanical Systems '92, Travemünde (German7), Feb. 4-7, 1992, IEEE 1992, pp. 226-231.

"Post-Packaging Tuning of Microresonators by Pulsed Laser Deposition", Chiao and Lin, The 12th International Conference on Solid State Sensors, Actuators and Microsystems, Boston, Jun. 8-12, 2003, IEEE, pp. 1820-1823.

* cited by examiner

METHOD FOR ADJUSTING THE FREQUENCY OF A MEMS RESONATOR

RELATED APPLICATION

This application is a divisional application of application Ser. No. 10/833,433 (now U.S. Pat. No. 7,102,467), filed Apr. 28, 2004, the contents of which are incorporated herein by reference.

BACKGROUND

This invention relates to microelectromechanical systems and/or nanoelectromechanical systems (collectively hereinafter "microelectromechanical systems") and techniques for fabricating microelectromechanical systems; and, more particularly, in one aspect, for adjusting, tune, setting, defining and/or selecting the output frequency of microelectromechanical resonators.

Many conventional micromechanical structures are based on the reaction (for example, oscillation, deflection or torsion) of a beam structure to an applied force. Such beam structures are often fabricated from monocrystalline or polycrystalline semiconductors. These materials have excellent mechanical strength and a high intrinsic quality factor.

However, manufacturing and material tolerances regarding such micromechanical structures often significantly impact the operation and/or function of the structure. For example, microelectromechanical resonators typically rely upon the bending beam and lateral oscillating beam structures. In this regard, manufacturing and material tolerances tend to lead to large variations of the resonance frequency of such resonators.

Notably, the beam structures of conventional resonators are often rectangular in shape and/or cross section. The mechanical stiffness ($k_M$) of a beam, as calculated with respect to the oscillation direction parallel to the width of the beam (w), is proportional to its Young's modulus (E) and certain measures of its geometry, including for a beam with a rectangular cross section, length (L) and height (h). That is:

$$k_M \approx \frac{E \cdot h \cdot w^3}{L^3} \qquad \text{EQUATION 1}$$

Setting aside electrostatic forces, the resonance frequency (f) of a beam may thus be defined under these assumptions by the equation:

$$f \approx \frac{1}{2 \cdot \pi} \cdot \sqrt{\frac{k_M}{m_{eff}}} \qquad \text{EQUATION 2}$$

where $m_{eff}$ is the effective mass for the resonating mode shape of the beam.

Thus, as is apparent from EQUATIONS 1 and 2, the dimensions and effective mass of the (moving) beam or electrode of a microelectromechanical resonator, and the capability of precisely and repeatedly controlling such dimensions and mass, are critical to accurately predicting (and/or controlling) the resonance frequency of the resonators.

Although conventional processes for manufacturing microelectromechanical resonator are relatively precise, such processes have inherent engineering or processing tolerances. Similarly, the tolerance/range of the material's characteristics and/or properties produce differences in Young's modulus, which are difficult to exactly predict, compensate, address and/or predetermine before fabrication. Such manufacturing and material tolerances may lead to relative large frequency variations even between identically designed resonators. Indeed, such frequency variations may be measurable (and likely unacceptable) even between microelectromechanical resonators that undergo identical processing/fabrication, for example, resonators fabricated on the same wafer.

There have been many attempts to address the issue of variations in the resonant frequency of a microelectromechanical resonator due to manufacturing and material tolerances. For example, one such technique employs a laser to vaporize material away from an open, unpackaged oscillator. In this technique, prior to packaging, the output frequency of the oscillator is measured. If adjustment is required to provide a particular output frequency, material disposed on the oscillator is removed in order to increase the frequency of the output. (See, for example, Noell et al., "MEMS for Watches", IEEE, 2004 0-7803-8265-X/04, pages 1–4). Once a suitable frequency is attained, the oscillator is packaged.

Another technique employs a laser to "move" a metal material from a nearby "sacrificial" metal layer onto the mechanical structure (comprised of a silicon material) of the microelectromechanical resonator. See, for example, Chiao and Lin, "Post-Packaging Tuning of Microresonators by Pulsed Laser Deposition", IEEE 2003, 0-7803-7731-1/03, pages 1820–1823. Here, the microelectromechanical resonator is hermetically sealed, via wafer bonding, with a glass wafer cap. The output of a laser is applied through the glass cap and incident on a metal layer disposed in the sealed chamber. The metal material is "blasted" off the cap and onto the oscillator mass. In this way, additional mass is deposited on, for example, the moving beam(s) or electrode(s), which decrease the resonant frequency of the microelectromechanical resonator.

Such a configuration, and, in particular, the glass wafer packaging and sacrificial metal layer, may, among other things, adversely impact the vacuum of the microelectromechanical resonator, particularly in view of the evaporation of the metal material within the resonator chamber. Such evaporation may produce unwanted contaminants within the chamber which, in turn, may adversely impact the operation of the resonator.

Thus, there is a need for a technique for tuning, setting, defining and/or selecting the output frequency of microelectromechanical resonator that overcomes one, some or all of the shortcomings of conventional techniques. There is a need for a technique that compensates for, and/or addresses, minimizes and/or eliminates the adverse affects of manufacturing and material tolerances of microelectromechanical resonator without contaminating the chamber of the resonator. Notably, it may be advantageous if such a technique does not rely on the incorporation of materials and/or techniques that are incompatible, or difficult to integrate with CMOS circuits.

SUMMARY OF THE INVENTION

There are many inventions described and illustrated herein. In a first principal aspect, the present invention is a method of adjusting the resonant frequency of a MEMS resonator, having a first resonant frequency. In one embodiment, the MEMS resonator comprises a first substrate anchor including a first electrical contact, a second substrate anchor including a second electrical contact, and a beam structure fixed at a first end by the first substrate anchor and at a second end by the second substrate anchor. The method comprises selecting a first heating current to apply to the first electrical contact and applying the first heating current to the MEMS resonator wherein applying the first heating current includes passing the first heating current from the first electrical contact to the second electrical contact to resistively heat the beam structure (for example, to temperatures that are greater than 300° C., between approximately 900° C. and approximately 1200° C., and/or greater than 1200° C.). In response, the material of the first beam structure changes to provide a second resonant frequency of the MEMS resonator.

In one embodiment, the method further includes measuring the first resonant frequency of the MEMS resonator and wherein the first heating current is selected based on the measured first resonant frequency. In another embodiment, the method further includes measuring the second resonant frequency of the MEMS resonator, calculating a second heating current to apply to the first electrical contact, and applying the second heating current to the MEMS resonator wherein applying the second heating current includes passing the second heating current from the first electrical contact to the second electrical contact to resistively heat the beam structure. In response to the second heating current, the material of the first beam structure changes to provide a third resonant frequency of the MEMS resonator.

The MEMS resonator may include a beam structure that comprises a multiple beam tuning fork structure, wherein each beam in the multiple beam tuning fork structure comprises a first end fixed by the first substrate anchor and a second end fixed by the second substrate anchor. In one embodiment, the beam structure comprises a high tension area, wherein the high tension area is resistively heated in response to the first electrical current thereby causing the material of the high tension area to change. In another embodiment, the high tension area is heated to a substantially higher temperature than other portions of the beam structure.

In another principal aspect, the present invention is a method of adjusting the resonant frequency of a MEMS resonator having a first resonant frequency. The MEMS resonator comprises a first substrate anchor including a first electrical contact, a second substrate anchor including a second electrical contact, and a beam structure fixed at a first end by the first substrate anchor and at a second end by the second substrate anchor. The method comprises applying a first heating current to the MEMS resonator wherein applying the first heating current includes passing the first heating current from the first electrical contact to the second electrical contact to resistively heat the beam structure (for example, to temperatures that are greater than 300° C., between approximately 900° C. and approximately 1200° C., and/or greater than 1200° C.). In response, material of the first beam structure (for example, monocrystalline and/or polycrystalline silicon material) evaporates therefrom to provide a second resonant frequency of the MEMS resonator.

The method may further include measuring the first resonant frequency of the MEMS resonator and determining the first heating current based on the measured first resonant frequency. The method may also include measuring the second resonant frequency of the MEMS resonator, determining a second heating current to apply to the first electrical contact, and applying the second heating current to the MEMS resonator wherein applying the second heating current includes passing the second heating current from the first electrical contact to the second electrical contact to resistively heat the beam structure. In response to such heating, the material of the first beam structure changes to provide a third resonant frequency of the MEMS resonator.

In yet another principal aspect, the present invention is a method of adjusting the resonant frequency of a MEMS resonator having a first resonant frequency. The MEMS resonator of this aspect of the invention comprises a beam structure and a frequency adjustment structure, wherein the frequency adjustment structure is comprised of polycrystalline silicon and includes first and second electrical contacts. The method comprises applying a first heating current to the frequency adjustment structure wherein applying the first heating current includes passing the first heating current from the first electrical contact to the second electrical contact to resistively heat the frequency adjustment structure (for example, to temperatures that are between approximately 900° C. and approximately 1200° C. and/or greater than 1200° C.). In response to heating the frequency adjustment structure, material of the frequency adjustment structure evaporates therefrom and deposits on the beam structure to provide a second resonant frequency of the MEMS resonator.

In one embodiment of this aspect of the invention, the method further includes measuring the first resonant frequency of the MEMS resonator and wherein the first heating current is selected based on the measured first resonant frequency. In another embodiment, the method further includes measuring the second resonant frequency of the MEMS resonator, calculating a second heating current to apply to the first electrical contact, and applying the second heating current to the MEMS resonator wherein applying the second heating current includes passing the second heating current from the first electrical contact to the second electrical contact to resistively heat the beam structure. In response to the second heating current, the material of the first beam structure changes to provide a third resonant frequency of the MEMS resonator.

Notably, the frequency adjustment structure may be integrated into a fixed electrode of the MEMS resonator.

The beam structure may include at least one high tension area, wherein in response to the first heating current, material of the frequency adjustment structure deposits on the high tension area. Indeed, in one embodiment, a substantial amount of the evaporated material of the frequency adjustment structure deposits on the high tension area.

Again, there are many inventions described and illustrated herein. This Summary of the Invention is not exhaustive of the scope of the present inventions. Moreover, this Summary is not intended to be limiting of the present inventions and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

There are many inventions described and illustrated herein. These inventions are directed to a method of fabricating a microelectromechanical resonator having an output frequency that may be adjusted, tuned, set, defined and/or selected whether before and/or after final packaging. In a first aspect, the method of the present invention adjusts, tunes, sets, defines and/or selects the frequency of the microelectromechanical resonator by changing and/or removing material from the mechanical structure of the resonator by resistively heating one or more elements and/or beams of the mechanical structure (for example, the moveable or expandable electrodes).

In this aspect of the present invention, an electrical current is applied to the moveable electrodes to resistively heat the electrode to a sufficient temperature so as to change and/or remove material from one or more moveable electrodes of the mechanical structure. In one embodiment, the material may be changed and/or removed from selected portions of the moveable electrode(s) (for example, the areas of high stress or tension). In another embodiment, material is changed and/or removed from all or substantially all of the active areas of the moveable electrodes (for example, those areas that oppose the fixed electrodes). In this way, the spring constant changes and/or the mass of the beam changes, which, in turn, causes a change in the frequency of the output of the resonator.

Figure 1:
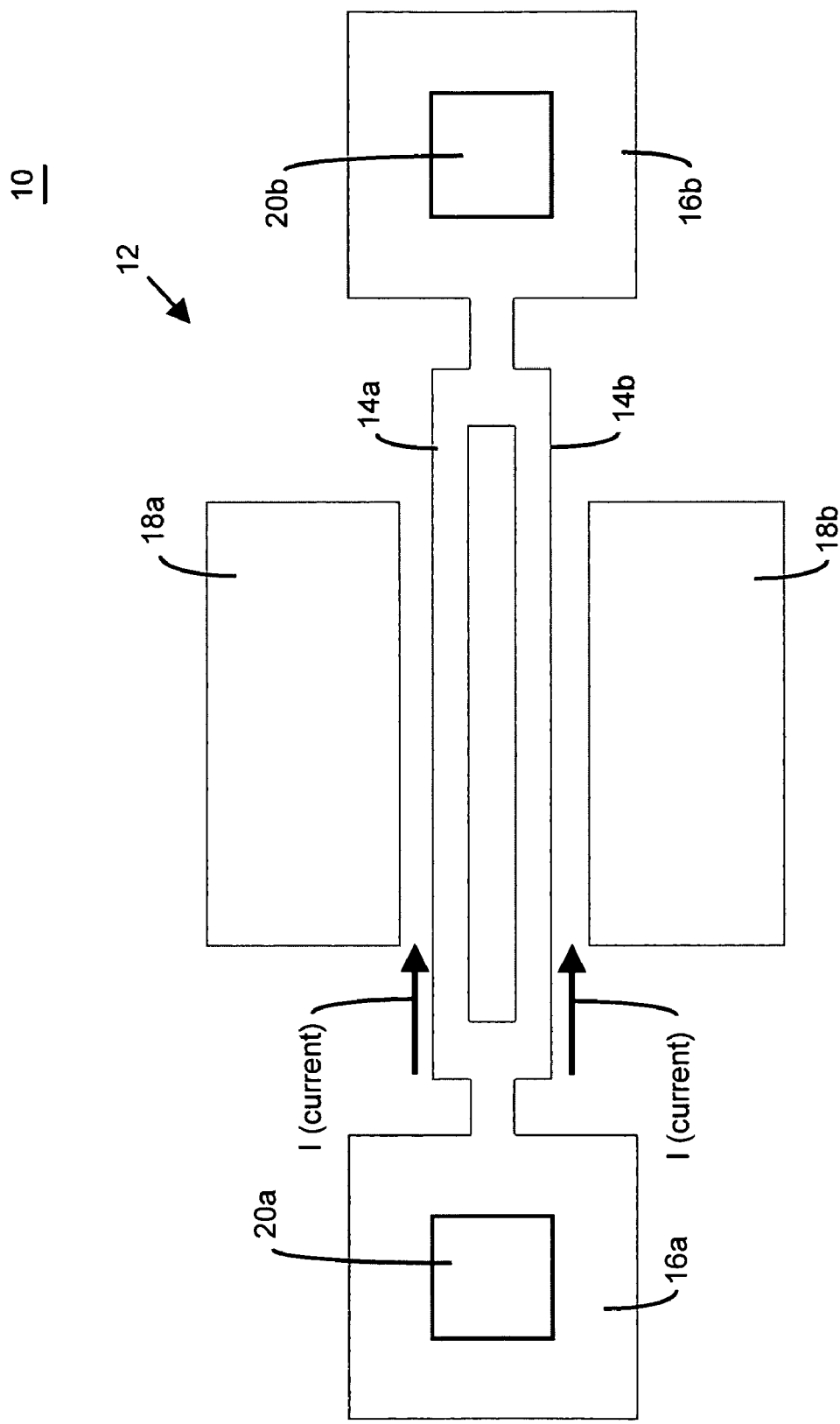
FIG. 1 illustrates a top view of a resonator, having two oscillating beams that are arranged in a tuning fork beam structure, according to one embodiment of a first aspect of the present invention.

For example, with reference to FIG. 1, in a first embodiment of this aspect of the present invention, MEMS resonator 10 includes mechanical structure 12 having moveable beams 14a and 14b disposed between anchors 16a and 16b. In this embodiment, moveable beams 14a and 14b are comprised of a material that includes a resistance in the presence of an electrical current, such as a conducting material (for example, a metal material) or semi-conducting material (for example, silicon and/or germanium).

The MEMS resonator 10 further includes fixed electrodes 18a and 18b and electrical contacts 20a and 20b. The electrical contacts 20a and 20b, in this embodiment, are connected to an electrical source (not illustrated) that provides an electrical current. For example, in one embodiment, electrical contact 20a is connected to the electrical source and electrical contact 20b is connected to a common and/or ground potential. In another embodiment, electrical contacts 20a and 20b are connected between terminals and/or contacts of the electrical source.

Notably, fixed electrodes 18a and 18b and electrical contacts 20a and 20b may be comprised of a conducting material (for example, a metal material such as aluminum) or semi-conducting material (for example, silicon, germanium, and/or impurity doped versions thereof). It may be advantageous to employ a material that has a relatively low resistivity and is suitable for, or compatible with, additional processing, for example, CMOS integration.

The electrical source (not illustrated) provides an electrical current that flows through moveable beams 14a and 14b and between electrical contacts 20a and 20b. In operation, an electrical current flows through moveable beams 14a and 14b, which are resistively heated. For example, where a higher voltage is applied to electrical contact 20a and a lower voltage is applied to (or exists at) electrical contact 20b, the electrical current (as conventionally designated) flows from electrical contact 20a to electrical contact 20b, as illustrated in FIG. 1.

Briefly, by way of background, an element having an electrical resistance (R) will convert electrical energy to thermal energy when an electrical current (I) is passed through the resistive element. In the context of the present invention, the power (P) dissipated in the form of heat by means of the resistive heating arising from application of a heating current (I) to the electrical resistance inherent in the beam structure may be characterized by the following equation:

$$P_{heat} = I^2 \cdot R_{beam} \qquad \text{EQUATION 3}$$

As such, heating current (I) flowing between electrical contacts 20a and 20b generates resistive heating in moveable beam 14. This resistive heating process may be accurately controlled, as described in detail below, to remove a predetermined amount of material from moveable beam(s) 14 to adjust, tune, set, define and/or select the frequency of the microelectromechanical resonator. Thereafter, MEMS resonator 10 provides a predetermined, selected and/or defined output frequency.

In those instances where moveable beams 14a and 14b are comprised of a polycrystalline silicon, resistively heating moveable beams 14a and 14b to, for example, temperatures in the range of approximately 300° C. to approximately 900° C. may anneal moveable beams 14a and 14b. In this way, the consistence and therefore the characteristics of moveable beams 14a and 14b may change. For example, larger grains may form, stress within the beams is released, which leads to a change in the Young's Modulus.

In addition, where moveable beams 14a and 14b are resistively heated to temperatures in the range of approximately 900° C. to approximately 1200° C., the monocrystalline and/or polycrystalline silicon surfaces of moveable beams 14a and 14b may begin to melt due, for example, to the lower binding energy of the surface atoms. Notably, this effect may depend on the surface passivation of the material of moveable beams 14a and 14b. For example, where the moveable electrodes are released using well known wet etching techniques and buffered HF mixtures (i.e., a buffered oxide etch) or well known vapor etching techniques using vapor HF, and later encapsulated using thin film encapsulation techniques, the chamber containing mechanical structures 12 of MEMS resonator 10 is sealed in a reactive $H_2$ environment thereby leaving chlorine and hydrogen terminated high reactive silicon surfaces. Notably, melting surfaces may reform to a lower surface energy state, which will likely change the geometry of moveable beams 14a and 14b, and therefore their stiffness.

Where moveable beams 14a and 14b are resistively heated to temperatures greater than approximately 1000° C. to 1200° C., the monocrystalline and/or polycrystalline silicon surfaces atoms of moveable beams 14a and 14b may begin to evaporate and migrate from the surface of moveable beams 14a and 14b to surrounding cold surfaces (for example, fixed electrodes 18a and 18b). In this way, moveable beams 14a and 14b thin, thereby changing the mass. In addition, the spring constant(s) of moveable beams 14a and/or 14b is/are also reduced.

For example, removal of several atomic layers (i.e., in the range of 1 nm) from the surface of moveable beams 14a and 14b may be sufficient to change the frequency of a 2 MHz continuous clamp-clamp two beam resonator (see FIG. 2B) by 114 ppm (where moveable beams 14a and 14b are in the range of 185 μm in length and 9 μm in width). EQUATIONS 1 and 2 provide a relationship between the stiffness and the width of a beam.

Figure 11:
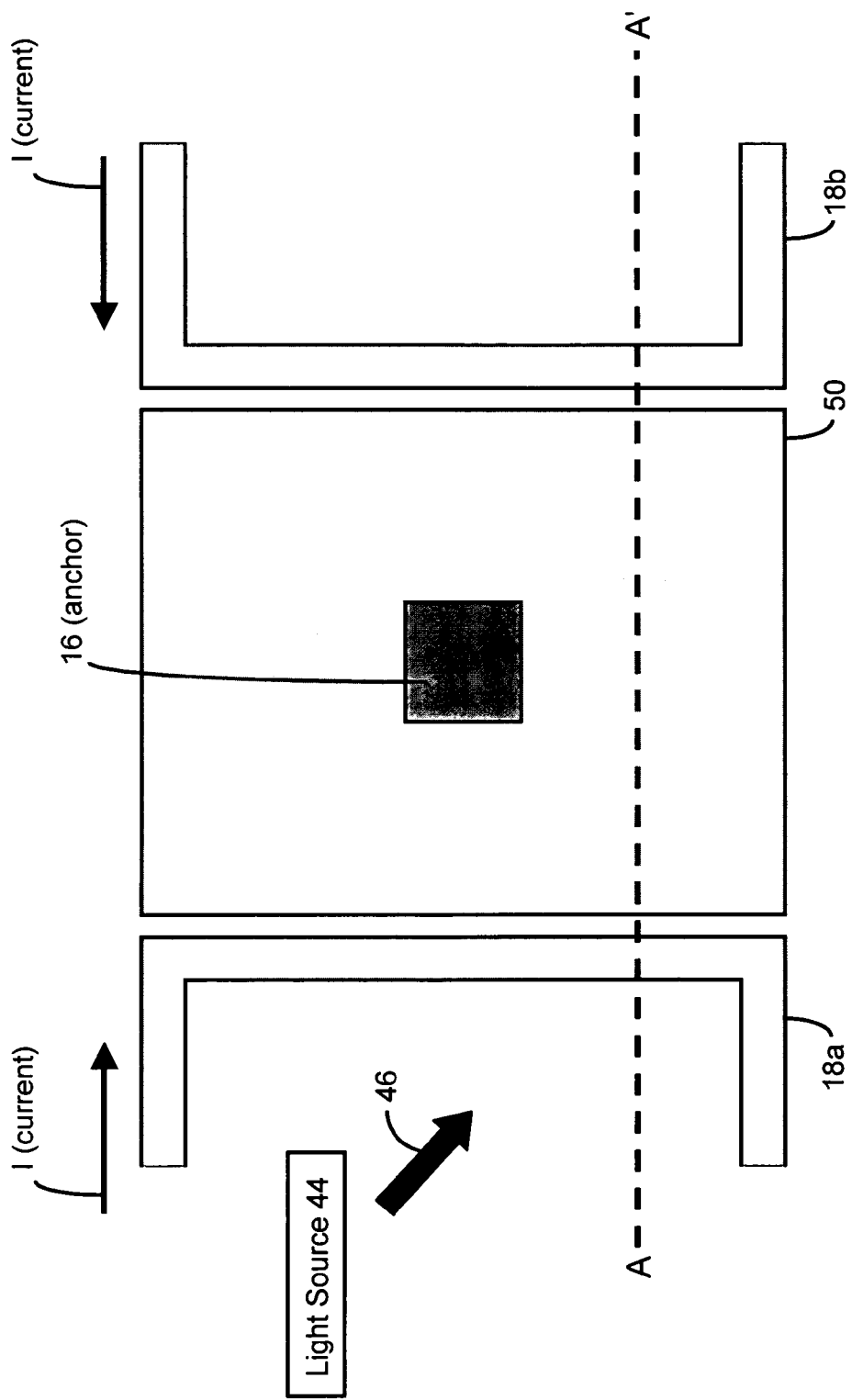
FIG. 11 illustrates a top view of a bulk-type resonator, having an expandable element and two fixed electrodes, according to an embodiment of the present invention.
Figure 12:
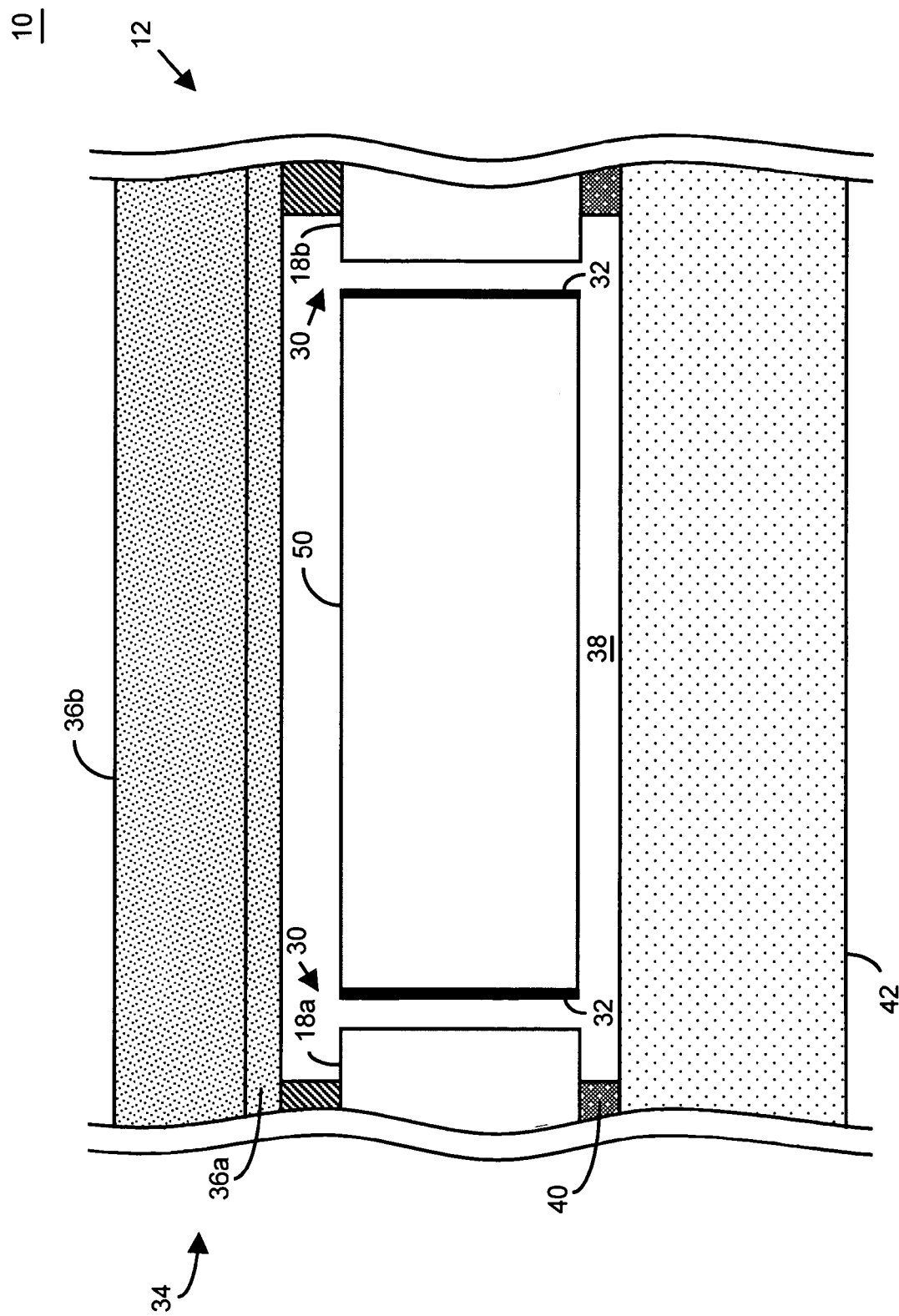
FIG. 12 illustrates a schematic cross-sectional view of the bulk-type resonator of FIG. 11, sectioned along dotted lines A–A'.

Notably, the present invention may employ any configuration, design and/or control of mechanical structure 12 of MEMS resonator 10. Indeed, all configurations, designs and/or control of mechanical structure 12, whether now known or later developed, are intended to fall within the scope of the present invention. For example, mechanical structure 12 may include (1) one or more moveable beams 14 disposed between one or more anchors 16, (2) bulk-type configurations (see, for example, FIGS. 11 and 12), and (3) structures oscillating in any and all directions, for example, in-plane and out-of-plane.

Moreover, there are many methods and techniques for fabricating MEMS resonator 10, including moveable beam (s) 14 and fixed electrodes 18. For example, the materials and/or layers of moveable beam(s) 14 may be deposited and thereafter, using well known lithographic, etching and/or doping techniques, moveable beam(s) 14 may be formed from such materials and/or layers. All methods of fabricating MEMS resonator 10, including moveable beam(s) 14, whether now known or later developed, are intended to be within the scope of the present invention.

In addition, in one embodiment, mechanical structure 12 is encapsulated, using a thin film or wafer level encapsulation techniques, in a chamber. In this regard, MEMS resonator 10 may be sealed or encapsulated using conventional thin film encapsulation techniques and structures. (See, for example, WO 01/77008 A1 and WO 01/77009 A1). Other thin film encapsulation techniques are suitable. Indeed, all thin film encapsulation techniques, whether now known or later developed, are intended to be within the scope of the present invention.

For example, the encapsulation techniques described and illustrated in non-provisional patent application "Microelectromechanical Systems Having Trench Isolated Contacts, and Methods of Fabricating Same", which was filed on Jun. 4, 2003 and assigned Ser. No. 10/455,555 (hereinafter "Microelectromechanical Systems Having Trench Isolated Contacts Patent Application") may be employed. All of the inventions/embodiments (including, for example, the mechanical structure fabrication, the encapsulation and the electrical isolation techniques) described and illustrated in the Microelectromechanical Systems Having Trench Isolated Contacts Patent Application may be implemented in conjunction with the temperature compensation techniques described and illustrated herein. For the sake of brevity, the embodiments described and illustrated in the Microelectromechanical Systems Having Trench Isolated Contacts Patent Application, implemented in conjunction with the temperature compensation techniques described and illustrated herein, will not be repeated in detail but will only be summarized. It is expressly noted, however, that the entire contents of the Microelectromechanical Systems Having Trench Isolated Contacts Patent Application, including, for example, the features, attributes, alternatives, materials, techniques and advantages of all of the inventions, are incorporated by reference herein.

In one embodiment, the resistive heating of moveable beams 14a and/or 14b is focused, concentrated and/or localized to provide selective and/or predetermined changes in, and/or removal of material from mechanical structure 12 of MEMS resonator 10. For example, with reference to FIG. 2A, in one embodiment, moveable beams 14a and/or 14b are designed and/or manufactured to provide focused, concentrated and/or localized heating of high tension areas 22 of moveable beams 14a and 14b. Notably, changing and/or removing material from high tension areas 22 may have a greater impact or effect on the frequency of MEMS resonator 10 (relative to other areas of moveable beams 14a and 14b) because of the change in mechanical stiffness of moveable beams 14a and 14b (see, for example, EQUATIONS 1 and 2).

The high tension areas 22 may be heated differently from other areas by providing a vertical and/or horizontal impurity doping profiles (for example, n-type impurities such as phosphorous) in or on moveable beams 14a and/or 14b. A doping profile provides higher or lower resistances at selective locations along moveable beams 14a and/or 14b. In this way, selective resistive heating is provided in moveable beam 14a and/or 14b as electrical current (I) is applied through electrical contacts 20a and 20b.

For example, high tension areas 22 may be more lightly doped (for example, undoped) with impurities than the other areas of moveable beams 14a and/or 14b. This provides high tension areas 22 with greater resistances to electrical current flow relative to other areas of moveable beams 14a and/or 14b. In this way, high tension areas 22 are heated to higher temperatures than other areas of moveable beams 14a and/or 14b.

In one embodiment, where moveable beams 14a and 14b are comprised of monocrystalline and/or polycrystalline silicon, resistively heating high tension areas 22 to temperatures greater than approximately 1000° C. to 1200° C., may cause the surfaces atoms of high tension areas 22 to evaporate and migrate from the surface of high tension areas 22 to surrounding colder surfaces. As mentioned above, in this embodiment, high tension areas 22 may attain higher temperatures for a given electrical current (I) than the other areas of moveable beams 14a and 14b. In this way, high tension areas 22 of moveable beams 14a and 14b may thin before other areas of moveable beams 14a and 14b. (See, FIG. 2B). The "thinning" of high tension areas 22 creates a selective change in mass of moveable beams 14a and 14b, which may selectively reduce the spring constant(s) of moveable beams 14a and/or 14b in the region pertaining to high tension areas 22.

Figure 2A:
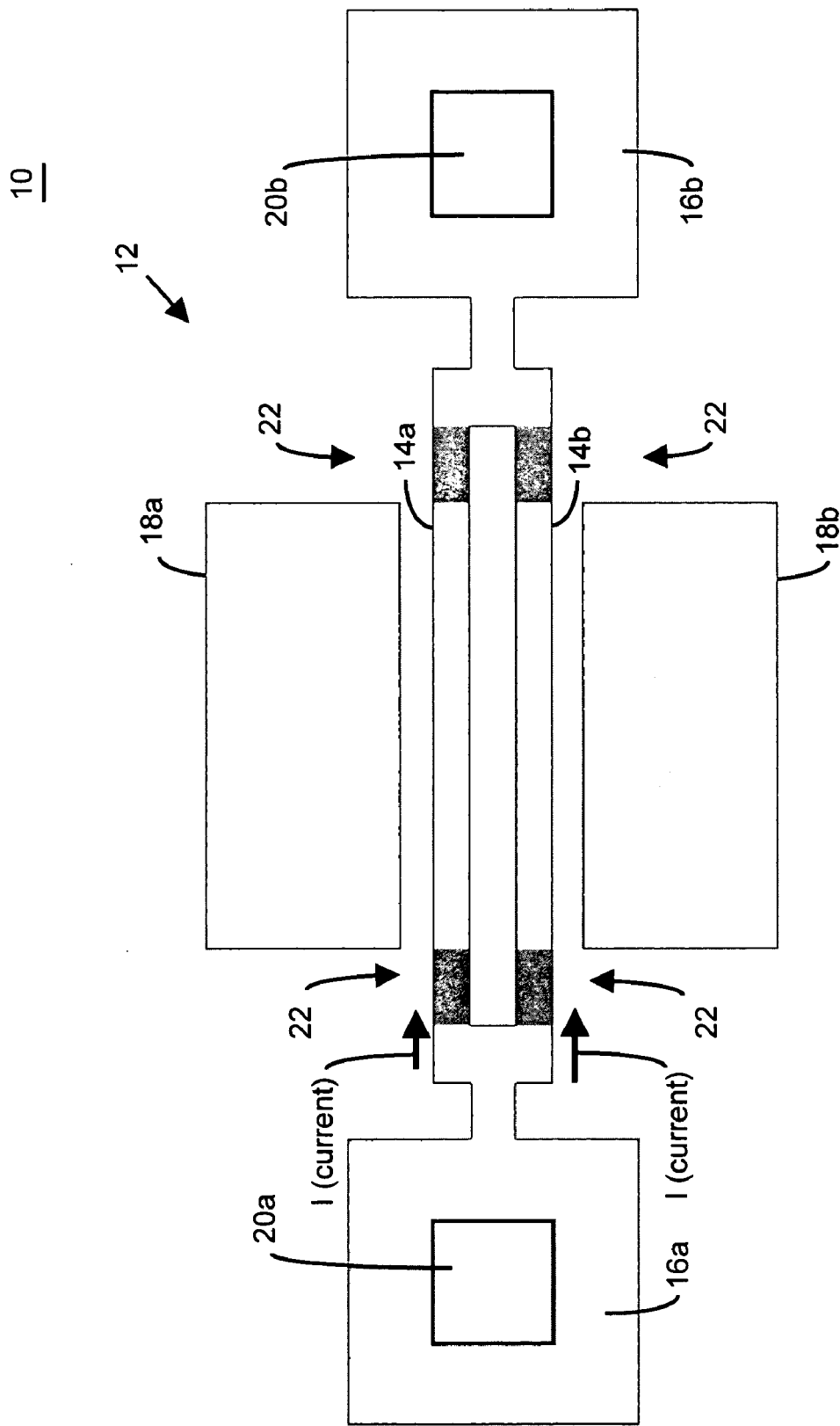
FIGS. 2A and 2B illustrate top views of a resonator, having two oscillating beams that are arranged in a tuning fork beam structure, according to a second embodiments of a first aspect of the present invention.
Figure 2B:
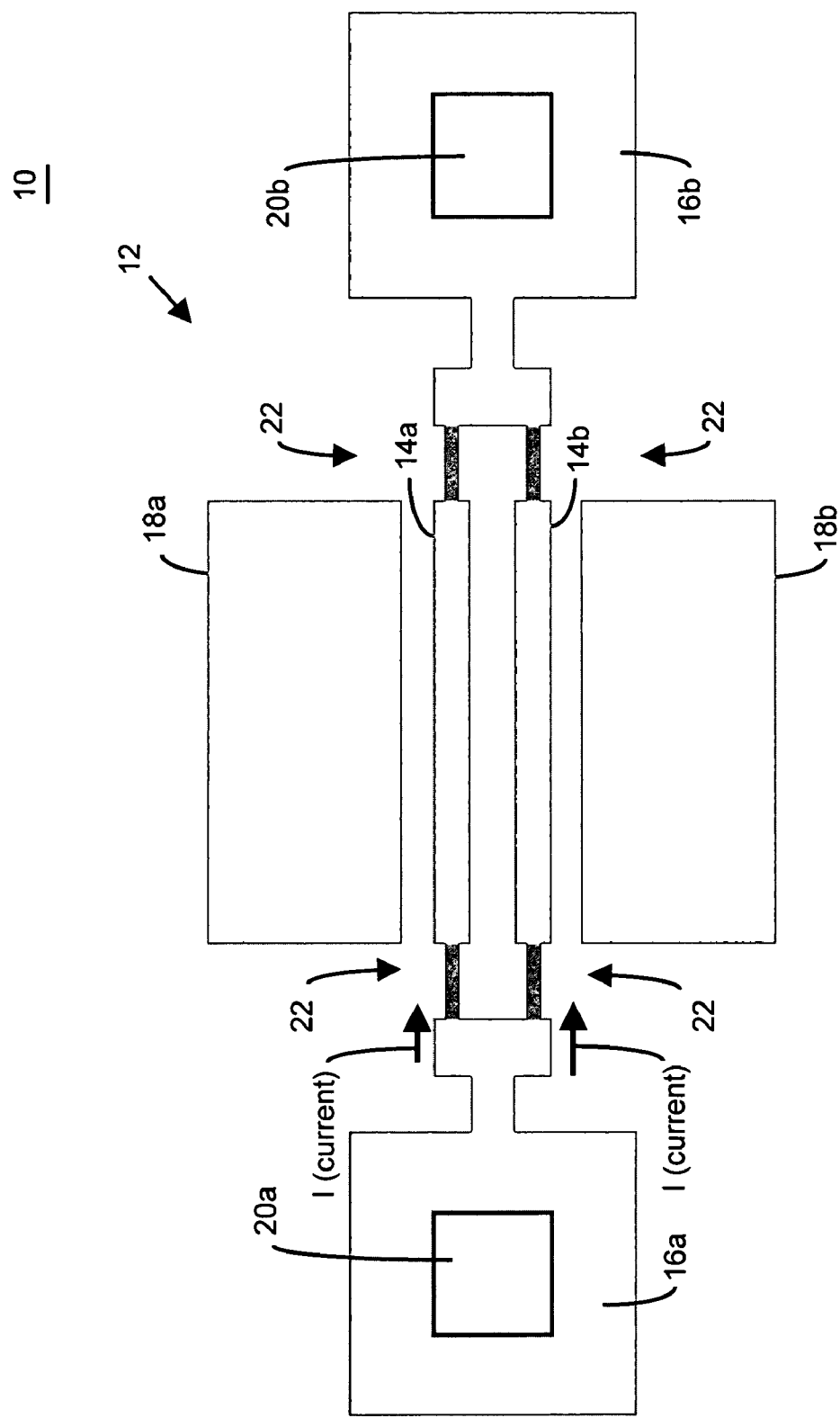

Notably, all methods and techniques for fabricating moveable beams 14, including high tension areas 22, of FIG. 2A, whether now known or later developed, are intended to be within the scope of the present invention. For example, the material(s) and/or layer(s) of moveable beam(s) 14 may be deposited and thereafter, using well known doping techniques, high tension areas 22 of moveable beam(s) 14 may be formed from such material(s) and/or layer(s). The heat flow through mechanical structure 12 to the surrounding material (for example, the heat flow through the substrate and anchors 16a and 16b), and its impact on such materials, should be considered when implementing the selective, concentrated and/or focused resistive heating techniques.

As mentioned above, an electrical source provides an electrical current that flows through moveable beams 14a and/or 14b and between electrical contacts 20a and 20b. In certain embodiments, all or substantially all of the heat is generated in high tension areas 22 as electrical current flows through moveable beams 14a and/or 14b because of the relative resistivities of the different areas of moveable beams 14a and/or 14b.

Figure 3:
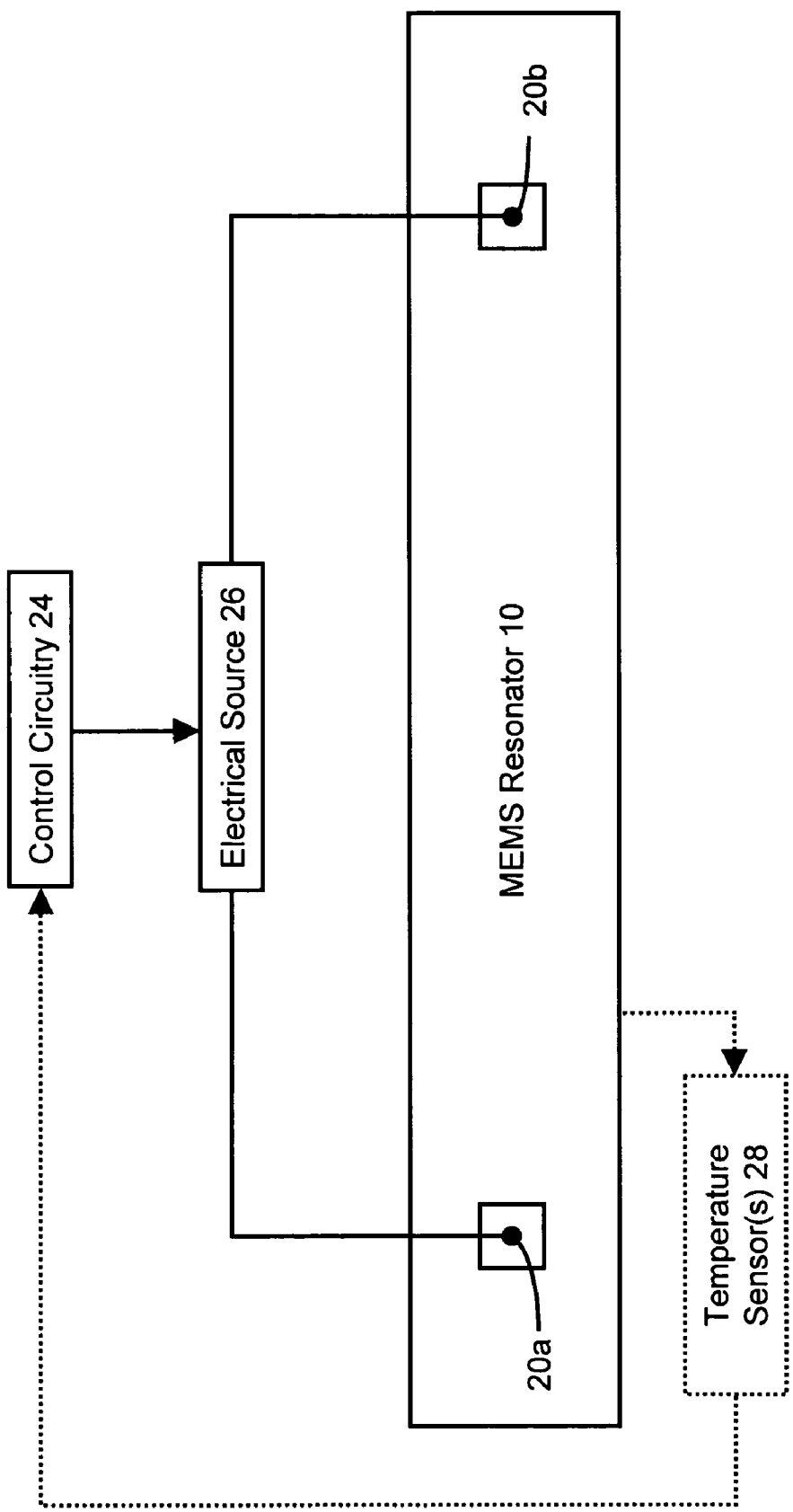
FIG. 3 is a schematic representation of an exemplary configuration to adjust and/or tune the frequency of the output a resonator, according to the first aspect of the present invention.

With reference to FIG. 3, in one embodiment of the present invention, control circuitry 24 determines and/or calculates the electrical current (from electrical source 26) required to adjust, tune, set, define and/or select the frequency of MEMS resonator 10 by changing and/or removing material from mechanical structure 12 of MEMS resonator 10 via resistively heating one or more elements and/or beams (or portions thereof of mechanical structure 12. The control circuitry 24 employs the "initial" or current frequency of the output of MEMS resonator 10 to determine and/or calculate an appropriate electrical current for a given design of MEMS resonator 10 at a given operating temperature or range of temperatures. Notably, control circuitry 24 may perform and/or implement the techniques of the present invention during, for example, fabrication, test, and/or calibration, which may be before and/or after final packaging.

The control circuitry 24 may employ a number of techniques to determine the appropriate heating required to adjust, tune and/or provide a particular output frequency of MEMS resonator 10. For example, based on an "initial" and/or current frequency, control circuitry 24 may employ a look-up table and/or a predetermined or mathematical relationship (either or both contained in resident memory, not illustrated) to adjust and/or control the heating of certain beam structures of MEMS resonator 10 to thereby compensate, adjust, and/or tune the frequency of the output of MEMS resonator 10 by changing and/or removing material from mechanical structure 12. The look-up table and/or a predetermined or mathematical relationship may be derived using empirical data based on the affects of resistively heating (as described above, for example, to a temperature in the range of approximately 300° C. to approximately 900° C. and/or in the range of approximately 900° C. to approximately 1200° C.) mechanical structure 12 on the frequency of the output signal. The resistive heating, which may be expressed as temperature, may be correlated to the electrical current output by electrical source 26. Notably, all techniques and/or configurations for controlling the resistive heating of certain beam structures of MEMS resonator 10 to compensate, adjust and/or tune the frequency of the output of MEMS resonator 10 (by changing and/or removing material from mechanical structure 12), whether now known or later developed, including those discussed above, are intended to be within the scope of the present invention.

Figure 4:
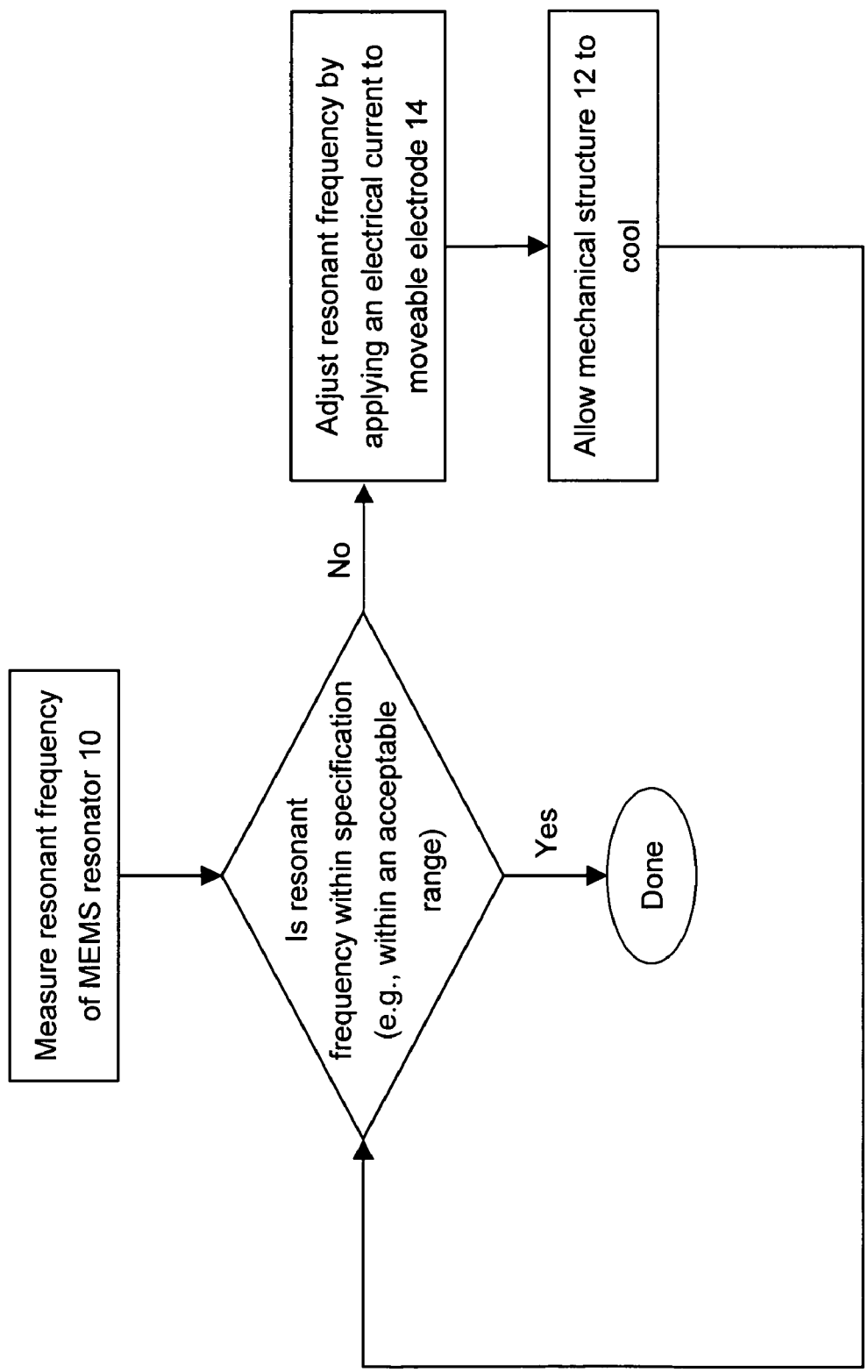
FIG. 4 is a flow diagram of an exemplary tuning technique of the resonator according to the first aspect of the present invention.

In certain embodiments of the present invention, the adjustment, compensation and/or tuning of the frequency of MEMS resonator 10 may be an iterative process. That is, the "initial" or current frequency of the output signal of MEMS resonator 10 may be measured, mechanical structure 12 may be subjected to resistive heating (as described above) and after cooling, control circuitry 24 may determine if additional adjustment and/or tuning of the frequency of MEMS resonator 10 is required based on the measured frequency of the output of MEMS resonator 10 (i.e., is the measured resonant frequency the desired, selected and/or predetermined resonant frequency and/or within an desired, acceptable and/or predetermined range of frequencies). If so, then the process is repeated. (See, for example, FIG. 4).

The process of adjusting and/or tuning the frequency of the output of MEMS resonator 10 may include any combination and/or permutation of resistive heating temperatures of moveable beam(s) 14 to adjust and/or tune the frequency of the output of MEMS resonator 10. In this regard, moveable beam 14a may first be resistively heated to a temperature of approximately 1200° C. After cooling, control circuitry 24 may determine (after measurement) that additional adjustment and/or tuning of the frequency of MEMS resonator 10 is required. In this second resistive heating process, moveable beam 14a may be heated to a temperature in the range of approximately 900° C. to less than approximately 1200° C. to provide a relatively smaller adjustment to the resonant frequency. Notably, the amount of time moveable beam 14a is subjected to the heating also has an effect of how much material is moved or removed. Thereafter, control circuitry 24 may determine that the resonant frequency is within a predetermined specification (i.e., range of frequencies such as 20 MHz±1%). As such, the combination of the heating processes provides proper adjustment and/or tuning of the resonant frequency of MEMS resonator 10. All combination and/or permutation of resistive heating temperatures are intended to fall within the scope of the present invention.

Notably, the "initial" and/or current frequency of MEMS resonator 10 may be measured, sampled, sensed before and/or after packaging or integration/incorporation. The MEMS resonator 10 may also be calibrated, adjusted and/or tuned at more than one operating condition (for example, more than one temperature).

During the resistive heating process, the temperature of certain structures of mechanical structure 12 (for example, moveable beam(s) 14) may be determined and/or measured using many different direct and indirect techniques. All techniques of determining and/or measuring the temperature of mechanical structure 12, including moveable beam(s) 14, are intended to fall within the scope of this invention. For example, in one embodiment, the electrical current may be measured and, based thereon, the temperature of moveable beam(s) 14 may be determined using, for example, empirical information or a mathematical relationship. In another embodiment, an optical infrared method of measuring the temperature may be employed.

In yet another embodiment, control circuitry 24 employs information/data from temperature sensors 28 (for example, diodes, transistors, resistors or varistors, and/or one or more MEMS temperature transducers which are disposed and/or located on or in the substrate of MEMS resonator 10) that are thermally coupled to moveable beam(s) 14 and/or those areas of moveable beam(s) 14 that are resistively heated (for example, high tension areas 22) to appropriately control the temporal and other characteristics (for example, amplitude) of the electrical current output by electrical source 26. The electrical source 26 may (dependently or independently) change and/or modify the electrical current applied through moveable beams 14a and/or 14b and thereby adjust the temperature of moveable beams 14a and/or 14b.

The temperature sensors 28 may be employed on and/or in close proximity to moveable beam(s) 14 and/or anchor 20 to measure, sense and/or sample information of the actual temperature of moveable beams 14a and 14b. It may be advantageous to locate temperature sensors 28 in areas where the material is neither (substantially) changed nor removed. For example, it may be advantageous to locate temperature sensors 28 in areas other than those areas where surfaces atoms evaporate (for example, high tension areas 22 of FIG. 2B).

The temperature sensors 28 provide information of the temperature of moveable beams 14a and 14b or region(s) in proximity to moveable beams 14a and 14b to control circuitry 24. In this way, control circuitry 24 may determine, calculate and/or estimate the temperature of moveable beams 14a and 14b and, in response, control and/or instruct electrical source 26 to apply or provide an appropriate current to thereby resistively heat moveable beams 14a and 14b (or selected portions thereof). In one embodiment, control circuitry 24 may compare the actual operating temperature to the predetermined, selected and/or desired temperature using one of a number of conventional feedback and/or control techniques, as discussed in more detail below.

In another aspect, the present invention employs resistive heating of one or more frequency adjustment structures to evaporate material onto the mechanical structure of the MEMS resonator. In one embodiment of this aspect of the invention, the frequency adjustment structure(s) are comprised of a monocrystalline and/or polycrystalline silicon materials and are disposed near (for example, directly proximate and/or opposing) the moveable members of the mechanical structure such that the material that evaporates from the frequency adjustment structures is deposited onto the moveable members. In another embodiment, the frequency adjustment structure(s) are comprised of a monocrystalline and/or polycrystalline silicon material and are located, relative to the mechanical structure so that the deposition of material from the frequency adjustment structure(s) is focused, concentrated and/or localized to provide selective and/or predetermined changes (i.e., thickening) of selective beams/members of the mechanical structure (for example, the high tension areas).

Figure 5:
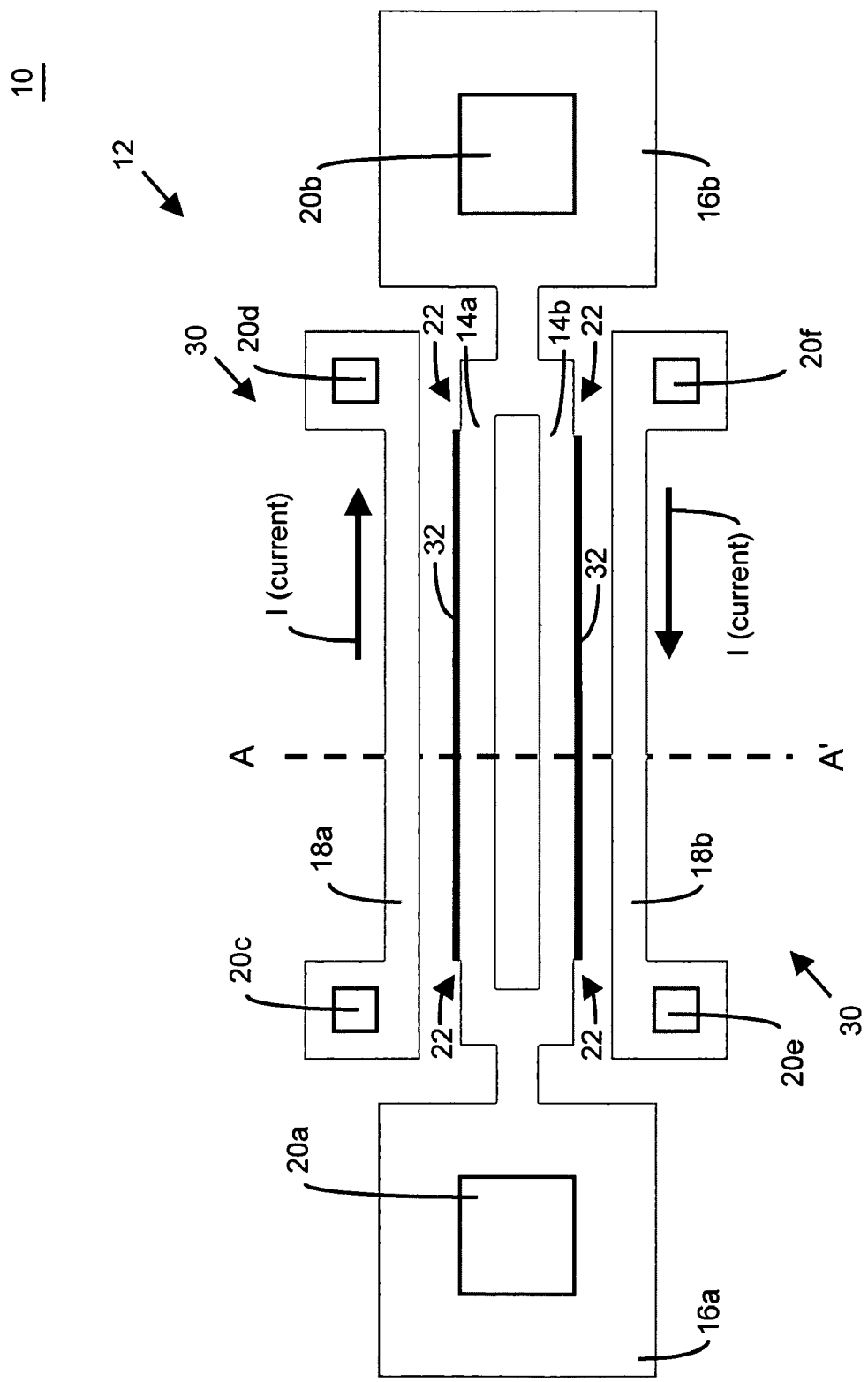
FIG. 5 illustrates a top view of a resonator, having two oscillating beams that are arranged in a tuning fork beam structure and integrated frequency adjustment structures, according to a first embodiment of a second aspect of the present invention.

With reference to FIG. 5, in one embodiment, one or more frequency adjustment structures 30 (in the illustrative example, four frequency adjustment structures) are spatially located, relative to mechanical structure 12, such that when frequency adjustment structures 30 are resistively heated, via an electrical current, to a temperature that causes atoms on the surface of frequency adjustment structures 30 to evaporate and migrate to the cooler surfaces of moveable beams 14a and 14b. In this way, the thickness of moveable beams 14a and 14b is increased (see FIG. 6) and, as such, the frequency of the output of MEMS resonator 10 is increased. For example, adding several atomic layers (i.e., in the range of 1 nm) onto the surface of moveable beams 14a and 14b may be sufficient to change the frequency of a 2 MHz continuous clamp-clamp two beam resonator (resonator 10 as illustrated in FIG. 5) by 114 ppm (where moveable beams 14a and 14b are in the range of 185 μm in length and 9 μm in width). EQUATIONS 1 and 2 provide a relationship between the stiffness and the width of a beam of a resonator.

Figure 6:
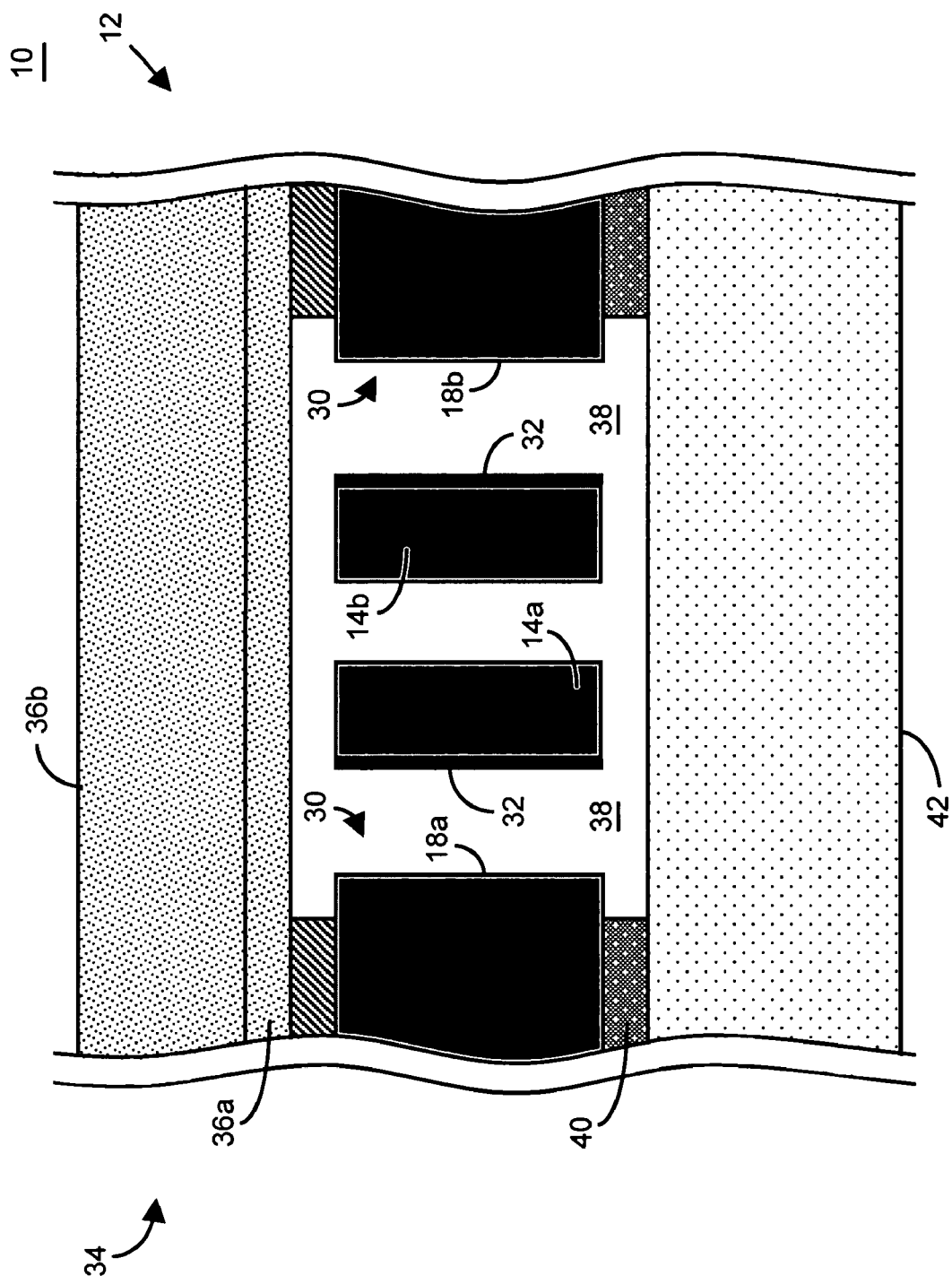
FIG. 6 illustrates a schematic cross-sectional view of the resonator of FIGS. 6 and 7, sectioned along dotted line A–A'.

With reference to FIG. 6, where frequency adjustment structures 30 are comprised of a monocrystalline and/or polycrystalline silicon, the monocrystalline and/or polycrystalline silicon surfaces are resistively heated to temperatures greater than approximately 1200° C. and surface atoms of frequency adjustment structures 30 may begin to evaporate and migrate to surrounding colder surfaces (for example, moveable beams 14a and 14b). In this way, moveable beams 14a and 14b are thickened by the addition of evaporated material 32. In addition, the spring constant(s) of moveable beams 14a and/or 14b may also be increased.

In one embodiment of this aspect of the invention, mechanical structure 12 is encapsulated, using a thin film or wafer level encapsulation techniques, in a chamber. In this regard, with continued reference to FIG. 6, MEMS resonator 10 includes encapsulation structure 34, including one or more encapsulation layers (here, 36a and 36b), to seal chamber 38. In the illustrative embodiment, encapsulation structure 34 includes first encapsulation layer 36a and second encapsulation layer 36b. As described in detail in the Microelectromechanical Systems Having Trench Isolated Contacts Patent Application, in one embodiment, first encapsulation layer 36a is deposited on a sacrificial layer, for example, silicon dioxide or silicon nitride, to secure, space and/or protect mechanical structure 12, including moveable beams 14a and 14b. Thereafter, passages or vents (not illustrated in this cross-section) are formed and/or etched in encapsulation layer 36a to permit or facilitate etching and/or removal of at least selected portions of the sacrificial layer and sacrificial/insulator layer 40 (which is disposed on substrate 42).

After etching and/or removal of at least selected portions of the sacrificial layer and sacrificial/insulator layer 40 and releasing of, for example, moveable beams 14a and 14b, second encapsulation layer 36b is deposited on first encapsulation layer 36a and in and/or on the vents or passages within first encapsulation layer 36a thereby "sealing" chamber 38.

Notably, other thin film encapsulation techniques are suitable. Indeed, as mentioned above, all thin film encapsulation techniques, whether now known or later developed, are intended to be within the scope of the present invention.

Figure 7:
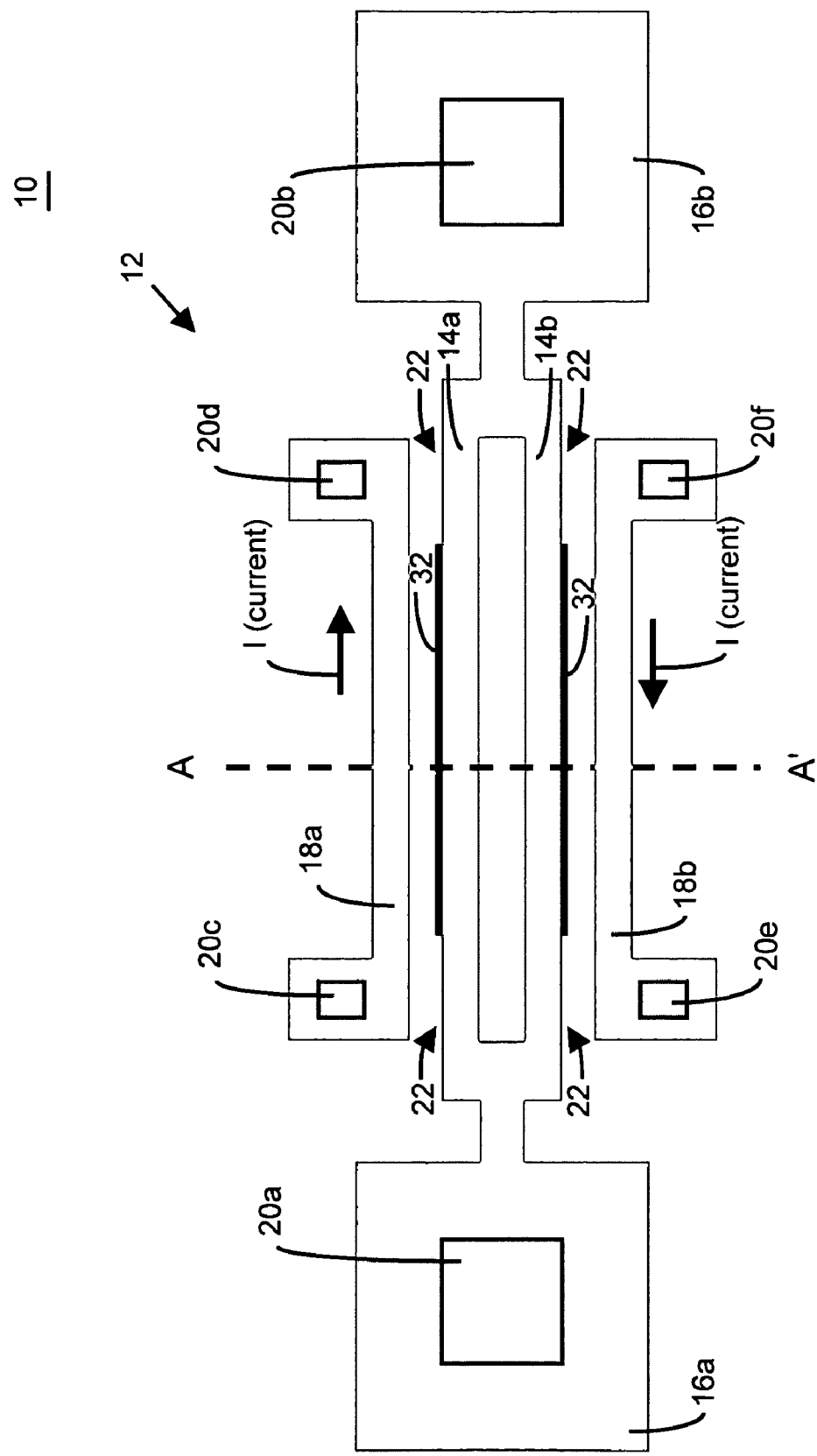
FIG. 7 illustrates a top view of a resonator, having two oscillating beams that are arranged in a tuning fork beam structure and integrated frequency adjustment structures, according to another embodiment of a second aspect of the present invention.

In those instances where small changes in frequency of MEMS resonator 10 are desired, it may be advantageous to design and locate frequency adjustment structures 30 such that areas of moveable beams 14a and 14b other than high tension areas 22 are selectively thickened. With reference to FIG. 7, in one embodiment, frequency adjustment structures 30 are located opposite moveable beams 14a and 14b. In this embodiment, however, frequency adjustment structures 30 do not oppose high tension areas 22 of moveable beams 14a and 14b. In this way, the majority of the surface atoms of frequency adjustment structures 30 that evaporate, in response to the resistive heating, migrate to areas of moveable beams 14a and 14b other than high tension areas 22. Thus, moveable beams 14a and 14b are thickened by the addition of evaporated material 32 but the impact or effect on the frequency of MEMS resonator 10 is not as large as when high tension areas 22 are thickened.

Figure 8A:
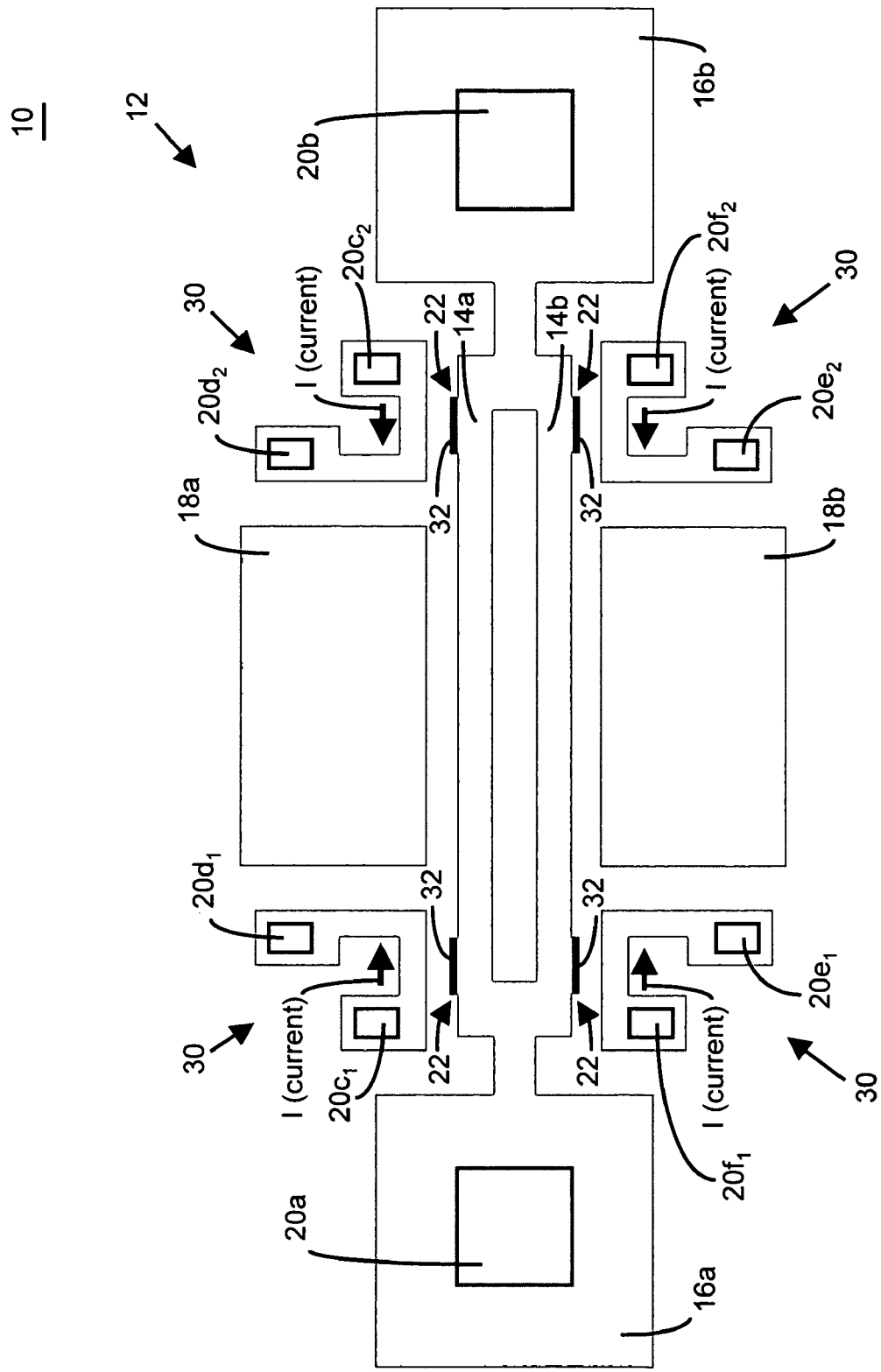
FIG. 8A illustrates a top view of a resonator, having two oscillating beams that are arranged in a tuning fork beam structure and a non-integrated frequency adjustment structures, according to another embodiment of a second aspect of the present invention.
Figure 8B:
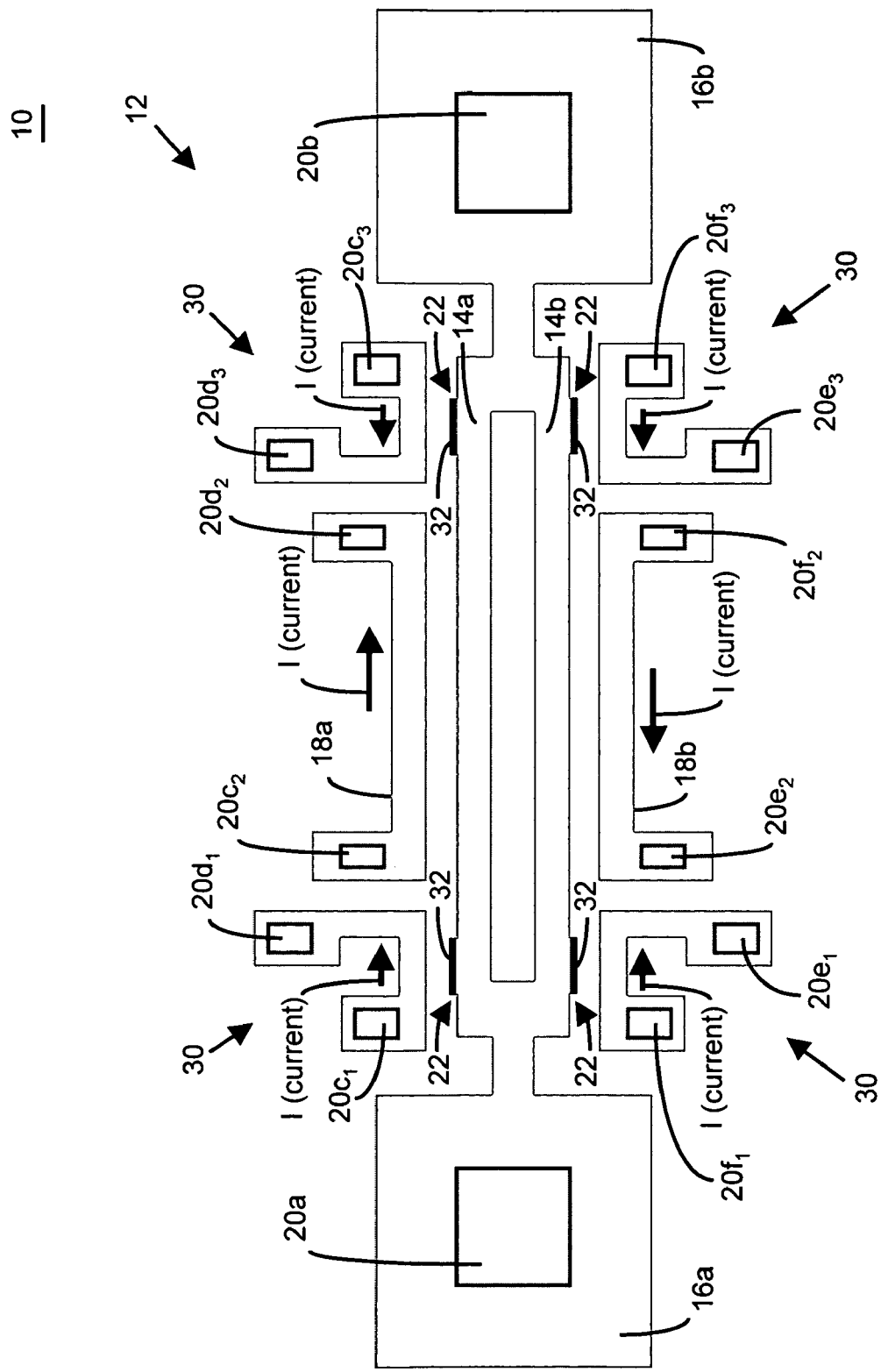
FIG. 8B illustrates a top view of a resonator, having two oscillating beams that are arranged in a tuning fork beam structure and integrated and non-integrated frequency adjustment structures, according to another embodiment of a second aspect of the present invention.

In contrast, with reference to FIGS. 8A and 8B, essentially only high tension areas 22 of moveable beams 14a and 14b may be selectively thickened by appropriately locating frequency adjustment structures 30 opposite and/or proximate only high tension areas 22. In this embodiment, larger changes in frequency may be readily obtained.

Notably, frequency adjustment structures 30 of FIGS. 5 and 7 are integrated with or into fixed electrode(s) 18. In contrast, frequency adjustment structures 30 of FIG. 8A are separate structures and, as such, not integrated with or into fixed electrode(s) 18. All permutations and combinations of integrated and non-integrated frequency adjustment structures 30 are intended to fall within the present invention. (See, for example, FIG. 8B wherein both integrated and non-integrated frequency adjustment structures 30 are illustrated).

Figure 9A:
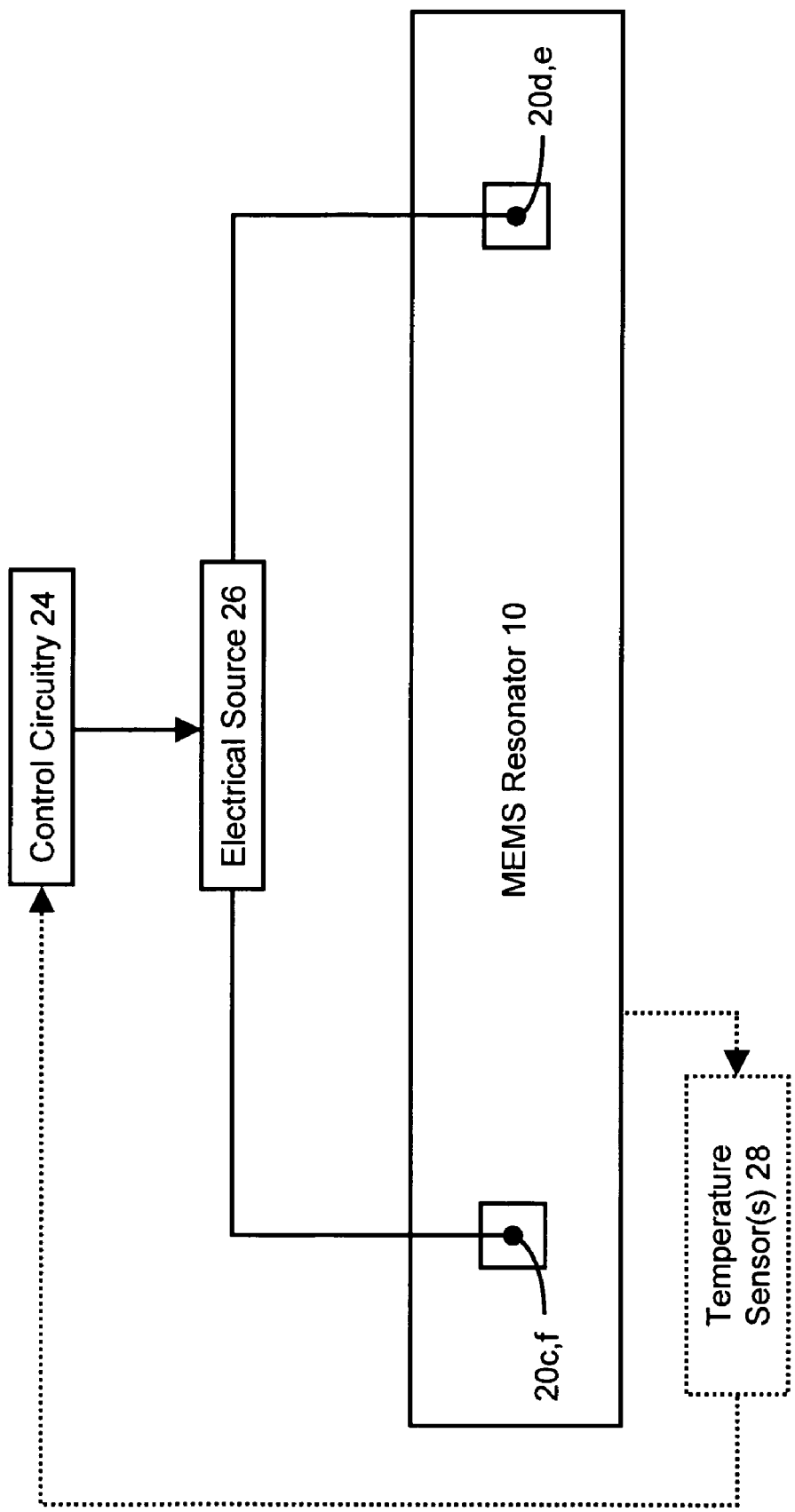
FIGS. 9A–9D are schematic representations of exemplary configurations to adjust and/or tune the frequency of the output a resonator, according to the third aspect of the present invention.

With reference to FIG. 9A, control circuitry 24 determines and/or calculates the electrical current (from electrical source 26) required to adjust, tune, set, define and/or select the frequency of MEMS resonator 10 by adding material to mechanical structure 12 (for example, to portions of moveable beams 14a and 14b) via resistive heating of one or more frequency adjustment structures 30. The control circuitry 24 may operate in the same or similar manner as described with reference to FIGS. 1 and 4. For the sake of brevity, that discussion will not be repeated.

In a third aspect, the present invention is directed to a method of adjusting, tuning, setting, defining and/or selecting the frequency of the output of MEMS resonator 10 (before and/or after final packaging) using the output of a light source (for example, a laser) to heat frequency adjustment structures 30. The MEMS resonator 10 of this aspect of the invention is encapsulated in a chamber using the thin film or wafer level encapsulation techniques described above. The frequency of MEMS resonator 10 is adjusted, tuned and/or set by adding material (via evaporation from frequency adjustment structures 30) to mechanical structures 12 (for example, the moveable or expandable electrodes). In one embodiment, the material may be added to selected portions of the moveable electrode(s) (for example, the areas of high stress or tension). In another embodiment, material is changed and/or removed from all or substantially all of the active areas of the moveable electrodes (for example, those areas that oppose the fixed electrodes).

Figure 10:
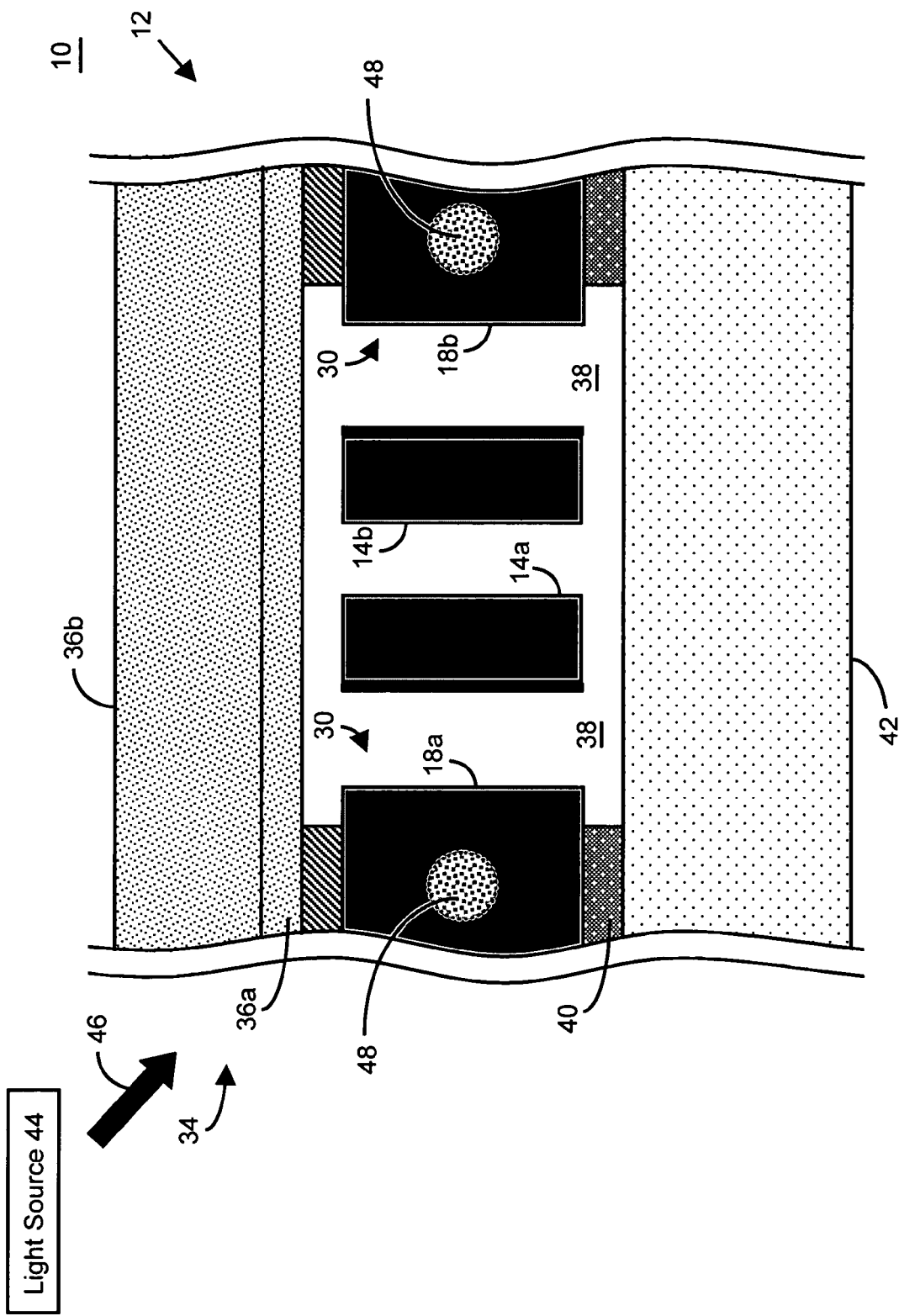
FIG. 10 illustrates a schematic cross-sectional view of the resonator of FIG. 5, sectioned along dotted lines A–A', in conjunction with a light source, for example, a laser, to adjust and/or tune the frequency of the output a resonator, according to the third aspect of the present invention.

With reference to FIG. 10, in one embodiment of this aspect of the present invention, light source 44 (for example, one or more lasers, lamps, light emitting diode (LED), electrical element or other mechanism for producing high energy radiation) outputs light 46 at a predetermined wavelength. The light 46 is focused and incident on frequency adjustment structures 30 and, responsively heats frequency adjustment structures 30. In those instances where frequency adjustment structures 30 are comprised of monocrystalline and/or polycrystalline silicon, the surfaces may be heated to temperatures greater than approximately 1000° C. to 1200° C. Accordingly, the monocrystalline and/or polycrystalline silicon surface atoms of frequency adjustment structures 30 may begin to evaporate and migrate to surrounding colder surfaces of opposing moveable beams 14a and 14b. In this way, moveable beams 14a and 14b are thickened by evaporated material 32. In addition, the spring constant(s) of moveable beams 14a and/or 14b may also be reduced.

In those instances where mechanical structure 12 is encapsulated, using a thin film or wafer level encapsulation techniques, in a chamber prior to final packaging, it may be advantageous to employ light source 44 and light 46 having optical properties (for example, a wavelength and focus) that are not absorbed by or in the encapsulation material(s) (i.e., the encapsulation structure is transparent to light source 44 and light 46). With continued reference to FIG. 10, MEMS resonator 10 may include encapsulation structure 34, including first and encapsulation layers 36a and 36b, to seal chamber 38. As described in detail in the Microelectromechanical Systems Having Trench Isolated Contacts Patent Application, in one embodiment, encapsulation structure 34 may be comprised of polycrystalline silicon or amorphous silicon materials. That is, first encapsulation layer 36a may be, for example, a polycrystalline silicon or amorphous silicon and second encapsulation layer 36b, which is deposited over or in vent in first encapsulation layer 36a to seal the chamber, may also be comprised of polycrystalline silicon or amorphous silicon.

In this embodiment, light 46 that includes a wavelength of about 700 nm to about 1900 nm and which is focused on frequency adjustment structures 30. Under these conditions, encapsulation structure 34 is sufficiently "transparent" to light 46 and the energy therein is applied and/or focused to frequency adjustment structures 30 (see focus areas 48). The monocrystalline and/or polycrystalline silicon surface atoms of frequency adjustment structures 30 may migrate to surrounding colder surfaces of opposing moveable beams 14a and 14b. In this way, moveable beams 14a and 14b are thickened by evaporated material 32.

Notably, in this embodiment, the heating and frequency adjustment of MEMS resonator 10 may be performed before final packaging but after encapsulation. Moreover, the heating and frequency adjustment may be performed after final packaging provided the package is sufficiently transparent to light 46 (and its wavelength).

The vertical local heating may be achieved via a wide laser beam, which is focused to a spot only in one horizontal plane. Although encapsulation structure 34, which is comprised of a polycrystalline silicon or amorphous silicon is sufficiently transparent to light 46, absorption of light 46 by the underlying frequency adjustment structures 30, and heating thereof, is necessary to evaporate polycrystalline silicon surface atoms of frequency adjustment structures 30 to thereby deposit evaporated material 32 on moveable beams 14a and 14b. Notably, the vertical focus is optimized to reduce the heating in encapsulation structure 34 and in substrate 42 and to create a hot spot (a three dimensional area) in the desired and/or predetermined location on or in mechanical structure 12.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive, and it should be understood that other, similar, as well as different, embodiments, features, materials, configurations, attributes, structures and advantages are within the scope of the present invention.

For example, as mentioned above, many (direct and indirect) temperature sensing and feedback techniques and/or configurations may be employed in the present invention. All temperature sensing and feedback techniques and/or configurations, whether now known or later developed, including those discussed above, are intended to be within the scope of the present invention.

Figure 9B:
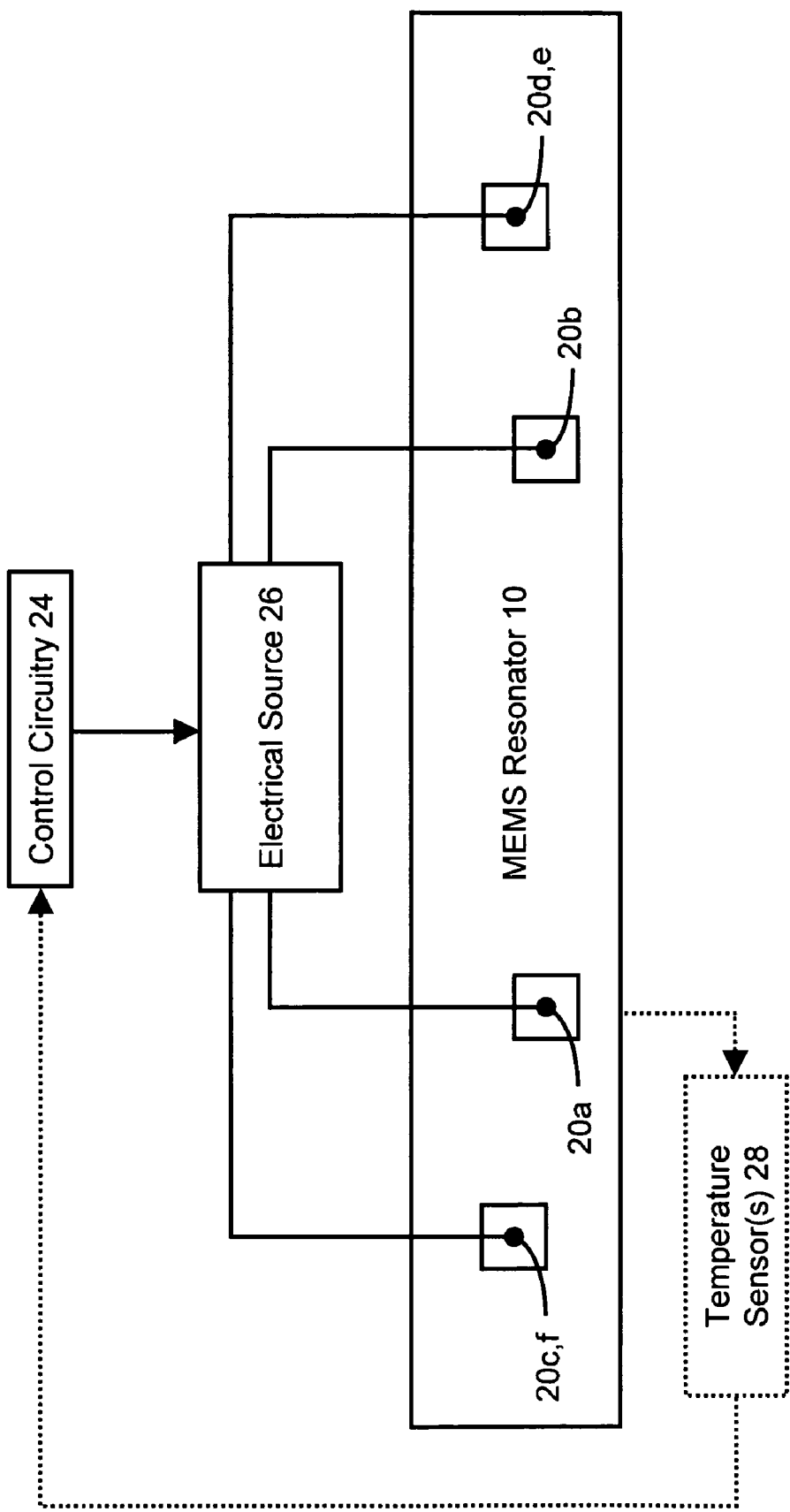
Figure 9C:
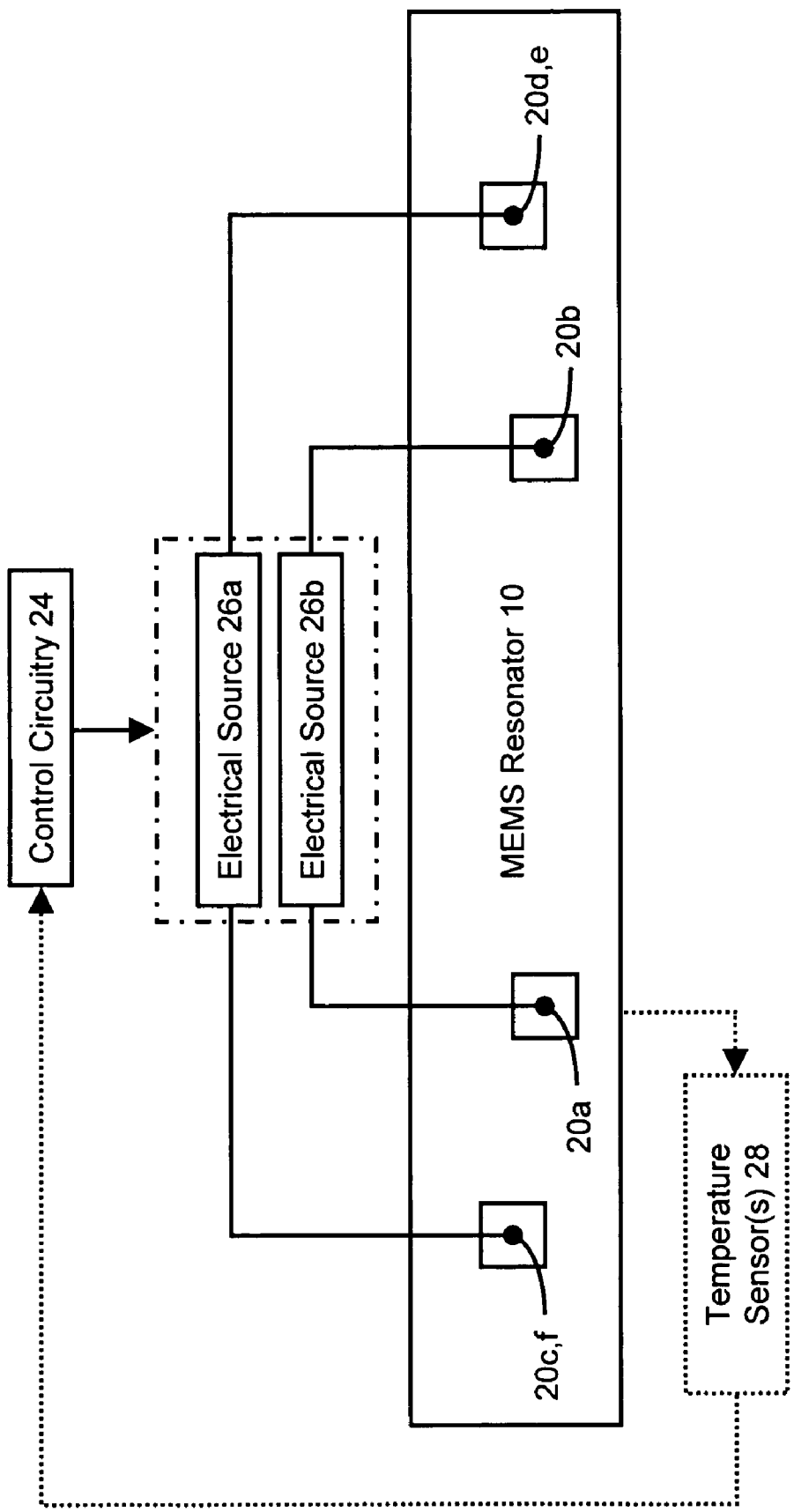
Figure 9D:
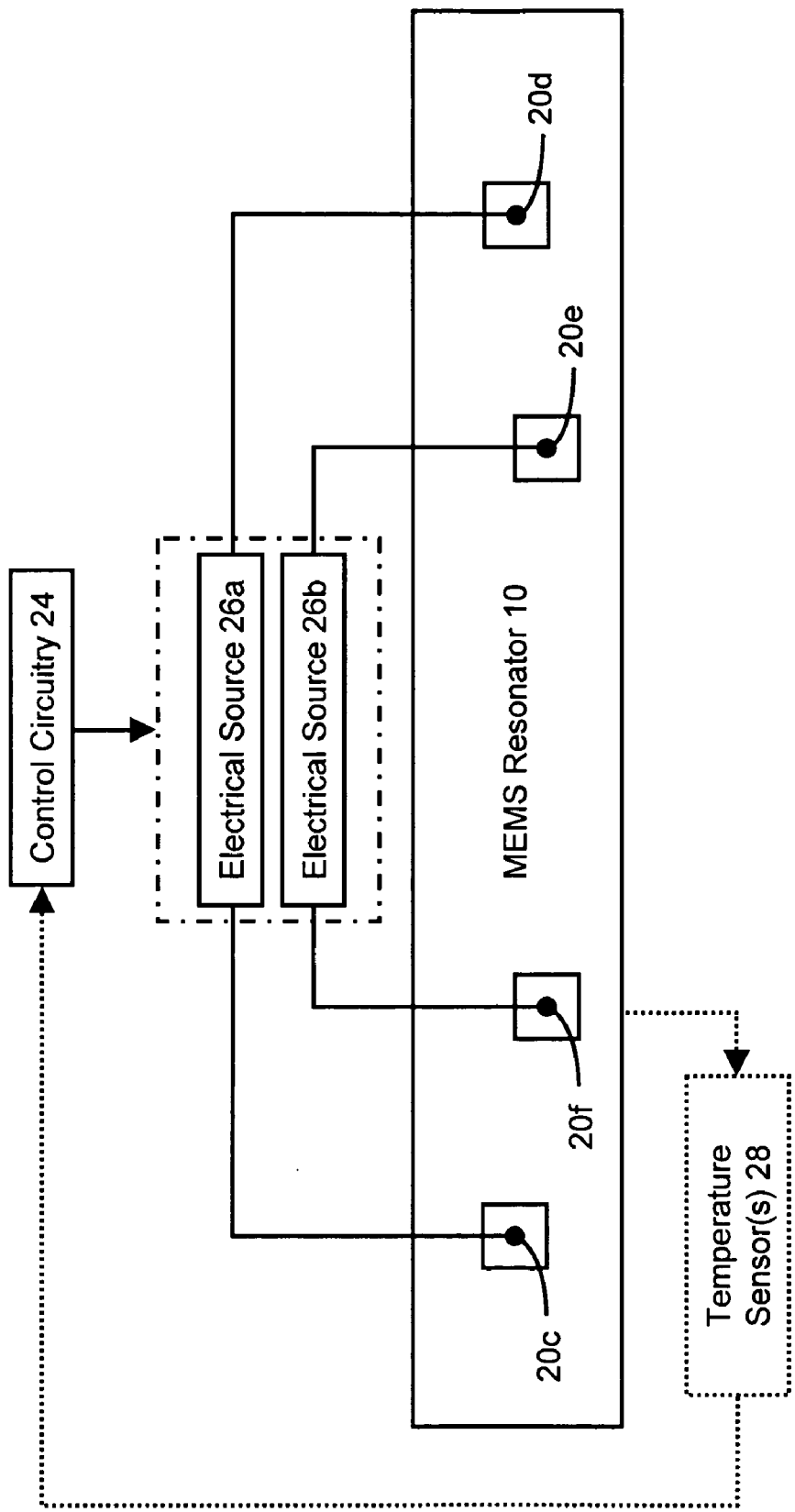

Further, the electrical source that provides current to the heating elements may include one or more independent sources to enhance the flexibility of the resistive heating of the moveable beam and/or the frequency adjustment structures. (See, for example, FIGS. 9B–9D). For example, one of a plurality of electrical sources may be "dedicated" to one or more frequency adjustment structures (see, FIGS. 9A and 9D) and/or one electrical source may be "dedicated" to one or more moveable beams (see, for example, FIGS. 9B, 9C and 9D). In this regard, the heating of the frequency adjustment structures and/or the moveable beams may be independently controlled via one or more electrical sources. All permutations and configurations of independently or dependently controlling the frequency adjustment structure(s) and/or the moveable beam(s) are intended to come within the present invention. Notably, control circuitry 24 may operate and/or control electrical source(s) 26 in the same or similar manner as described with reference to FIGS. 1 and 4. For the sake of brevity, that discussion will not be repeated.

Further, the present inventions may employ any temperature sensor or sensing technique, whether now known or later developed. For example, the present inventions may employ a temperature sensing technique using the moveable beam itself as a first temperature sensor and at least a second temperature sensor, disposed in the resonator, which measures, for example, the temperature of the substrate distant from the heating element(s) or sufficiently disposed therefrom such that the heating element(s) do not prevent the sensor from detecting, sampling and/or measuring the temperature of the substrate. In this embodiment, the nonconformal temperature of the moveable beam may depend on the temperature difference between the desired beam temperature and the temperature of the substrate. Thus, by calculating and/or determining this difference, the actual temperature of the moveable beam may be approximated and/or extrapolated using, for example, a look-up table that correlates the aforementioned difference and the actual temperature.

Alternatively, the control circuitry may employ a predetermined or mathematical relationship to estimate the temperature of the moveable beam wherein that relationship uses temperature difference between the desired beam temperature and the temperature of the substrate. Such temperature sensing techniques may significantly improve the temperature estimate of the moveable beam, which in turn, may result in an enhanced accuracy of the frequency of the output signal of the MEMS resonator.

The present invention may be implemented on unpackaged resonators which may be heated at a wafer level on a probe station at, for example, final wafer probing. An open plastic package (i.e., a pre-molded package) may also be employed. Alternatively, the present invention may be implemented on packaged resonators, before the lid is attached and/or secured.

Notably, although anchors 16 are illustrated as freestanding and square-shaped, any anchor structure may be employed which secures mechanical structure 12 to, for example, the substrate. That is, anchors 16 may be directly attached to the substrate or fixed in relation to a substrate through intervening/overlaying layer(s) or structure(s). Indeed, anchors 16 may employ any form of anchoring techniques, whether now known or later developed. For example, the present invention may employ the anchoring techniques described and illustrated in non-provisional patent application entitled "Anchors for Microelectromechanical Systems Having an SOI Substrate, and Method for Fabricating Same", which was filed on Jul. 25, 2003 and assigned Ser. No. 10/627,237 (hereinafter "Anchors for Microelectromechanical Systems Patent Application"). In this regard, any and all of the embodiments of MEMS resonator 10 according to the present inventions may be anchored, for example, to a substrate, using the anchors (and anchoring techniques) as described and illustrated in Anchors for Microelectromechanical Systems Patent Application. For the sake of brevity, the anchoring techniques of Anchors for Microelectromechanical Systems Patent Application, implemented in conjunction with the inventions described and illustrated herein, will not be repeated in detail. It is expressly noted, however, that the entire contents of the Anchors for Microelectromechanical Systems Patent Application, including, for example, the features, attributes, alternatives, materials, techniques and advantages of all of the embodiments and/or inventions, are incorporated by reference herein.

Moreover, MEMS resonator 10, as mentioned above, may be encapsulated using any thin film encapsulation techniques, whether now known or later developed. For example, the present invention may employ the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments of MEMS resonator 10 according to the present invention may be encapsulated using the techniques described and illustrated in Microelectromechanical Systems and Method of Encapsulating Patent Application. Moreover, MEMS resonator 10 according to the present invention may also include or employ the techniques of fabricating the mechanical structure and electrically isolating contact areas and/or field areas from other electrically conductive materials, as described and illustrated in Microelectromechanical Systems and Method of Encapsulating Patent Application. For the sake of brevity, the encapsulation and isolation techniques of Microelectromechanical Systems and Method of Encapsulating Patent Application, implemented in conjunction with the inventions described and illustrated herein, will not be repeated. It is expressly noted, however, that the entire contents of the Microelectromechanical Systems and Method of Encapsulating Patent Application, including, for example, the features, attributes, alternatives, materials, techniques and advantages of all of the embodiments and/or inventions, are incorporated by reference herein.

Further, while the exemplary embodiments of the present inventions have been described in the context of microelectromechanical systems including micromechanical structures or elements, the present inventions are not limited in this regard. Rather, the inventions described herein are applicable to other electromechanical systems including, for example, nanoelectromechanical resonators. Thus, the present inventions may be pertinent to electromechanical systems, for example, resonators, made in accordance with fabrication techniques, such as lithographic and other precision fabrication techniques, which reduce mechanical components to a scale that is generally comparable to microelectronics.

As mentioned above, MEMS resonator 10 may employ any type of MEMS design and/or control, whether now known or later developed, including those discussed in detail above. For example, bulk-type resonators (see, for example, FIGS. 11 and 12) as well as resonators oscillating in all directions, in-plane and out-of-plane, are applicable. The resonator configurations of the illustrative examples are not to be construed or interpreted in a limiting sense.

In the context of bulk-type resonators, the frequency is proportional to the geometry and material of the resonator. The frequency is directly proportional to the width in the direction of oscillation. As such, material deposition (from opposing frequency adjustment structures 30 which is integrated with fixed electrodes 18a and 18b) may increase the length of expanding and contracting electrode 50 of bulk resonators. (See, for example, FIGS. 11 and 12). In this way, the frequency of MEMS resonator 10 may be lowered.

Alternatively, moveable beam(s) 14 of the bulk-type resonator may be heated (using electrical source 26 and/or light source 44) as described in the first aspect of the present invention. That is, initially the material of moveable beam(s) 14 may be annealed and thereafter the change in frequency of MEMS resonator 10 may be measured, detected, sampled and/or determined by control circuitry 24. The surface material of moveable beam(s) 14 may also be changed by melting and/or evaporation, via application of a higher electrical current (I) or higher intensity of light 46, and thereafter the change in frequency of MEMS resonator 10 may be measured, detected, sampled and/or determined by control circuitry 24.

Although the exemplary embodiments of the present invention have illustrated frequency adjustment structures that are laterally displaced from moveable beams 14a and 14b, frequency adjustment structures may be disposed vertically in addition or in lieu thereof. Thus, by incorporating frequency adjustment structures above and/or below mechanical structures 12, material deposition may be accomplished in the vertical plane. This technique may be advantageous for resonators 10 oscillating in all directions, in plan and out of plane.

The terms "resonator", "MEMS resonator" or "micromechanical resonator" as used throughout this description cover a broad class of micro-machined structures and useful combinations of these structures. Such combinations typically include electronic circuitry, such as circuitry used to drive, power, monitor, and control the resonator. Micromachined structures, such as holes, channels, cantilevers, bending beams, springs, tuning forks, membranes, substrate anchors, electrical contacts, etc., are building blocks for more complex devices, such as transducers. A transducer is generally any device capable of converting one form of energy into another. Transducers, including sensors and actuators, are an example of the type of devices susceptible to the benefits of the present invention.

Contemporary resonators often include at least one micromachined structure generally referred to hereafter as a "beam structure." The term is broadly construed to cover any transducer designed to mechanically move when acted upon by an external force (for example, electrical, magnetic, and/or physical). Single bending beams, multiple beam tuning forks are examples of beam structures. Both continuous and discrete structures are encompassed by the term beam structure.

It should be further noted that while the present inventions have been described in connection with SOI, other substrates are suitable. For example, the first semiconductor layer may be materials in column IV of the periodic table, for example, silicon, germanium, carbon; also combinations of these, for example, silicon germanium, or silicon carbide; also of III-V compounds, for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped). Indeed, the first semiconductor layer may also be a metal or metal type material (in which case it would be a first conductor layer disposed on the first substrate layer). Notably, the mechanical structure (for example, moveable beam 14) may be comprised of the same materials as described above with respect to the first semiconductor layer.

It should be further noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, a processor(s), a state machine, a group of state machines, software, a processor(s) implementing software, or a combination of a circuit (whether integrated or otherwise), a group of such circuits, a state machine, group of state machines, software, a processor(s) and/or a processor(s) implementing software, processor(s) and circuit(s), and/or processor(s) and circuit(s) implementing software.

Finally, the term "data" may mean, among other things, a current or voltage signal(s) whether in an analog or a digital form. The term "measure" means, among other things, sample, sense, inspect, detect, monitor and/or capture. The phrase "to measure" or similar, means, for example, to sample, to sense, to inspect, to detect, to monitor and/or to capture.

What is claimed is:

1. A MEMS device comprising:
a microelectromechanical resonator having a beam structure which includes a resonant frequency;
a frequency adjustment structure, juxtaposed the beam structure, having a plurality of electrical contacts, wherein material of the frequency adjustment structure, in response to being resistively heated by a heating current, evaporates therefrom and deposits on the beam structure to change the resonant frequency of the beam structure; and wherein the heating current resistively heats the frequency adjustment structure to between approximately 900° C. and approximately 1200° C.

2. The MEMS device of claim 1 further including a fixed electrode wherein the frequency adjustment structure is integrated with the fixed electrode.

3. The MEMS device of claim 1 further including a fixed electrode wherein the frequency adjustment structure is disposed adjacent the fixed electrode.

4. The MEMS device of claim 3 wherein the beam structure includes a high tension area and wherein the frequency adjustment structure is disposed adjacent the high tension area.

5. The MEMS device of claim 1 wherein the frequency adjustment structure comprises a monocrystalline silicon.

6. The MEMS device of claim 1 wherein the heating current resistively heats the frequency adjustment structure to greater than 300° C.

7. The MEMS device of claim 1 wherein the frequency adjustment structure comprises a polycrystalline silicon.

8. The MEMS device of claim 1 wherein the beam structure includes a high tension area and wherein the material deposits substantially on the high tension area.

9. The MEMS device of claim 1 further including a fixed electrode, and wherein the frequency adjustment structure includes (i) a first structure which is integrated with the fixed electrode and (ii) a second structure which is disposed adjacent the fixed electrode.

10. A MEMS device comprising:
a microelectromechanical resonator having (i) a beam structure, which includes a resonant frequency, and (ii) a fixed electrode;
a frequency adjustment structure, having a plurality of electrical contacts, wherein frequency adjustment structure includes a silicon material, and wherein, in response to being resistively heated by a heating current, a portion of the silicon material evaporates therefrom and deposits on the beam structure to change the resonant frequency of the beam structure.

11. The MEMS device of claim 10 wherein the silicon material is a polycrystalline silicon or a monocrystalline silicon.

12. The MEMS device of claim 10 wherein the frequency adjustment structure is integrated with the fixed electrode.

13. MEMS device of claim 10 wherein the frequency adjustment structure is disposed adjacent the fixed electrode.

14. The MEMS device of claim 13 wherein the beam structure includes a high tension area and wherein the frequency adjustment structure is disposed adjacent the high tension area.

15. The MEMS device of claim 10 wherein the beam structure comprises a monocrystalline or polycrystalline silicon.

16. The MEMS device of claim 10 wherein the heating current resistively heats the frequency adjustment structure to greater than 900° C.

17. The MEMS device of claim 10 wherein the heating current resistively heats the frequency adjustment structure to between approximately 900° C. and approximately 120° C.

18. The MEMS device of claim 10 wherein the beam structure includes a high tension area and wherein the silicon material deposits substantially on the high tension area.

19. The MEMS device of claim 10 wherein the frequency adjustment structure includes (i) a first structure which is integrated with the fixed electrode and (ii) a second structure which is disposed adjacent the fixed electrode.

20. The MEMS device of claim 10 wherein the heating current resistively heats the frequency adjustment structure to greater than approximately 900° C.

21. The MEMS device of claim 10 wherein the heating current resistively heats the frequency adjustment structure to greater than approximately 1200° C.

22. A method of adjusting the resonant frequency of a MEMS resonator, wherein the MEMS resonator comprises a first electrical contact, a second electrical contact, and a beam structure coupled to at least one substrate anchor, and wherein the MEMS resonator includes a first resonant frequency, the method comprising;
determining a first heating current to apply to the first electrical contact, wherein the first heating current is determined using the first resonant frequency; and
passing the first heating current from the first electrical contact to the second electrical contact to resistively heat the beam structure, wherein, in response, the material of the beam structure changes to provide a second resonant frequency of the MEMS resonator.

23. The method of claim 22 further including:
measuring the second resonant frequency of the MEMS resonator;
determining a second heating current; and
passing the second heating current from the first electrical contact to the second electrical contact to resistively heat the beam structure, wherein, in response, the material of the beam structure changes to provide a third resonant frequency of the MEMS resonator.

24. The method of claim 22 wherein the beam structure includes a multiple beam tuning fork structure, wherein each beam in the multiple beam tuning fork structure includes a first end fixed by a first substrate anchor.

25. The method of claim 22 wherein the first heating current resistively heats the beam structure to greater than 300° C.

26. The method of claim 22 wherein the beam structure includes a high tension area, wherein the high tension area is resistively heated in response to the first heating current thereby causing the material of the high tension area to change.

27. The method of claim 22 wherein the beam structure includes a high tension area, wherein in response to the first heating current, the high tension area is heated to a substantially higher temperature than other portions of the beam structure.

28. A method of adjusting the resonant frequency of a MEMS resonator, wherein the MEMS resonator comprises a first electrical contact, a second electrical contact, and a beam structure fixed to a substrate via a substrate anchor, and wherein the MEMS resonator includes a first resonant frequency, the method comprising:
passing a first heating current from the first electrical contact to the second electrical contact to resistively heat the beam structure, wherein, in response, material of the beam structure evaporates therefrom to provide a second resonant frequency of the MEMS resonator, wherein the first heating current resistively heats at least a portion of the beam structure to between approximately 900° C. and approximately 1200° C.; and
measuring the second resonant frequency of the MEMS resonator.

29. The method of claim 28 further including applying a second heating current to the MEMS resonator wherein applying the second heating current includes passing the second heating current from the first electrical contact to the second electrical contact to resistively heat the beam structure, wherein, in response, the material of the beam structure changes to provide a third resonant frequency of the MEMS resonator.

30. The method of claim 29 further including determining the second heating current using the measured second resonant frequency.

31. The method of claim 28 wherein the beam structure includes a multiple beam tuning fork structure, wherein each beam in the multiple beam tuning fork structure includes a first end fixed by a first substrate anchor.

32. The method of claim 28 wherein the beam structure includes a high tension area, wherein in response to the first heating current, the high tension area is heated to a substantially higher temperature than other portions of the beam structure.

33. A method of adjusting the resonant frequency of a MEMS resonator, wherein the MEMS resonator comprises a beam structure and a frequency adjustment structure, wherein the frequency adjustment structure includes polycrystalline silicon and includes first and second electrical contacts, and wherein the MEMS resonator includes a first resonant frequency, the method comprising:
passing a first heating current from the first electrical contact to the second electrical contact to resistively heat the frequency adjustment structure, wherein, in response, polycrystalline silicon of the frequency adjustment structure evaporates therefrom and deposits on the beam structure to provide a second resonant frequency of the MEMS resonator; and
measuring the second resonant frequency of the MEMS resonator.

34. The method of claim 33 further including:
measuring the first resonant frequency of the MEMS resonator; and
determining the first heating current using the measured first resonant frequency.

35. The method of claim 33 further including:
determining a second heating current; and
applying the second heating current to the frequency adjustment structure wherein applying the second heating current includes passing the second heating current from the first electrical contact to the second electrical contact to resistively heat the frequency adjustment structure, wherein, in response, additional material of the frequency adjustment structure deposits on the beam structure to provide a third resonant frequency of the MEMS resonator.

36. The method of claim 33 wherein the frequency adjustment structure is integrated with a fixed electrode of the MEMS resonator.

37. The method of claim 33 wherein the beam structure includes a high tension area, wherein in response to the first heating current, material of the frequency adjustment structure deposits on the high tension area.

38. The method of claim 33 wherein the beam structure includes a plurality of high tension areas, wherein in response to the first heating current, a substantial amount of the evaporated material of the frequency adjustment structure deposits on the high tension areas.

39. The method of claim 33 wherein the frequency adjustment structure and the beam structure includes polycrystalline silicon material.

40. A MEMS device comprising:
a microelectromechanical resonator having (i) a beam structure which includes a resonant frequency, and (ii) a fixed electrode;
a frequency adjustment structure, juxtaposed the beam structure, having a plurality of electrical contacts, wherein material of the frequency adjustment structure, in response to being resistively heated by a heating current, evaporates therefrom and deposits on the beam structure to change the resonant frequency of the beam structure; and
wherein the frequency adjustment structure includes (i) a first structure which is integrated with the fixed electrode and (ii) a second structure which is disposed adjacent the fixed electrode.

41. The MEMS device of claim 40 wherein the beam structure includes a high tension area and wherein the frequency adjustment structure is disposed adjacent the high tension area.

42. The MEMS device of claim 40 wherein the frequency adjustment structure comprises a monocrystalline silicon.

43. The MEMS device of claim 40 wherein the heating current resistively heats the frequency adjustment structure to greater than 300° C.

44. The MEMS device of claim 40 wherein the frequency adjustment structure comprises a polycrystalline silicon.

45. The MEMS device of claim 40 wherein the beam structure includes a high tension area and wherein the material deposits substantially on the high tension area.

46. The MEMS device of claim 40 wherein the heating current resistively heats the frequency adjustment structure to greater than approximately 900° C.

47. The MEMS device of claim 40 wherein the heating current resistively heats the frequency adjustment structure to greater than approximately 1200° C.

* * * * *